US009206501B2

(12) United States Patent
Sung et al.

(10) Patent No.: US 9,206,501 B2
(45) Date of Patent: Dec. 8, 2015

(54) METHOD OF MANUFACTURING ORGANIC LIGHT-EMITTING DISPLAY APPARATUS BY USING AN ORGANIC LAYER DEPOSITION APPARATUS HAVING STACKED DEPOSITION SOURCES

(75) Inventors: Un-Cheol Sung, Yongin (KR); Mu-Hyun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 783 days.

(21) Appl. No.: 13/487,050

(22) Filed: Jun. 1, 2012

(65) Prior Publication Data
US 2013/0032829 A1    Feb. 7, 2013

(30) Foreign Application Priority Data

Aug. 2, 2011    (KR) .................. 10-2011-0076990

(51) Int. Cl.
C23C 16/448    (2006.01)
B05D 5/06    (2006.01)
C23C 14/04    (2006.01)
(Continued)

(52) U.S. Cl.
CPC .............. C23C 14/044 (2013.01); C23C 14/12 (2013.01); C23C 14/243 (2013.01); C23C 16/45574 (2013.01); C23C 16/45576 (2013.01); H01L 27/1292 (2013.01)

(58) Field of Classification Search
CPC ... C23C 16/448; C23C 16/45563; B05D 5/06
See application file for complete search history.

(56) References Cited

U.S. PATENT DOCUMENTS 5,454,847 A    10/1995 Jacoboni et al.
6,099,649 A    8/2000 Schmitt et al.
(Continued)

FOREIGN PATENT DOCUMENTS

EP    1 413 644 A2    4/2004
EP    1 418 250 A2    5/2004
(Continued)

OTHER PUBLICATIONS

Biganzoli, Ilaria, et al., "A Supersonic Plasma Jet Source for Controlled and Efficient Thin Film Deposition". Journal of Modern Physics, 2012, 3, 1626-1638.*
(Continued)

*Primary Examiner* — Bret Chen
(74) *Attorney, Agent, or Firm* — Christie, Parker & Hale, LLP

(57) ABSTRACT

A method of manufacturing an organic light-emitting display apparatus includes: disposing an organic layer deposition apparatus to be apart from a substrate by a set distance; and depositing deposition material on the substrate while the organic layer deposition apparatus or the substrate is moved relative to the other, the deposition source apparatus including: a deposition source including a first deposition source and a second deposition source stacked on the first deposition source; a deposition source nozzle unit including a second deposition source nozzle unit at a side of the second deposition source to face the substrate and including a plurality of second deposition source nozzles, and a first deposition source nozzle unit at the side of the second deposition source to face the substrate and including a plurality of first deposition source nozzles formed to pass through the second deposition source; and a patterning slit sheet smaller than the substrate.

11 Claims, 12 Drawing Sheets

(51) Int. Cl.
*C23C 14/12* (2006.01)
*C23C 14/24* (2006.01)
*C23C 16/455* (2006.01)
*H01L 27/12* (2006.01)

(56) References Cited

U.S. PATENT DOCUMENTS

| | | |
|---|---|---|
| 6,274,198 B1 | 8/2001 | Dautartas |
| 6,371,451 B1 | 4/2002 | Choi |
| 6,749,906 B2 | 6/2004 | Van Slyke |
| 7,322,248 B1 | 1/2008 | Long |
| 2001/0006827 A1 | 7/2001 | Yamazaki et al. |
| 2002/0076847 A1 | 6/2002 | Yamada et al. |
| 2002/0168577 A1 | 11/2002 | Yoon |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0016907 A1 | 1/2004 | Shi |
| 2004/0115338 A1 | 6/2004 | Yoneda |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0056535 A1* | 3/2005 | Nagashima et al. ..... 204/192.12 |
| 2005/0072361 A1 | 4/2005 | Yang et al. |
| 2005/0166842 A1 | 8/2005 | Sakamoto |
| 2005/0205811 A1* | 9/2005 | Partlo et al. ............... 250/504 R |
| 2005/0208220 A1* | 9/2005 | Long et al. ................. 427/255.6 |
| 2005/0217584 A1 | 10/2005 | Abiko et al. |
| 2005/0263074 A1 | 12/2005 | Masuda et al. |
| 2006/0011136 A1 | 1/2006 | Yamazaki et al. |
| 2006/0144325 A1 | 7/2006 | Jung et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2007/0077358 A1 | 4/2007 | Jeong et al. |
| 2007/0178708 A1 | 8/2007 | Ukigaya |
| 2007/0195844 A1 | 8/2007 | Ma et al. |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0229524 A1 | 9/2009 | Kim et al. |
| 2009/0232976 A1 | 9/2009 | Yoon et al. |
| 2009/0304906 A1 | 12/2009 | Suduo et al. |
| 2010/0170439 A1 | 7/2010 | Negishi |
| 2010/0255198 A1 | 10/2010 | Cleary et al. |
| 2010/0275842 A1 | 11/2010 | Park et al. |
| 2010/0297348 A1 | 11/2010 | Lee et al. |
| 2010/0297349 A1 | 11/2010 | Lee et al. |
| 2011/0042659 A1* | 2/2011 | Kim et al. ....................... 257/40 |
| 2011/0052791 A1 | 3/2011 | Jo et al. |
| 2011/0052795 A1* | 3/2011 | Choi et al. ....................... 427/69 |
| 2011/0165327 A1 | 7/2011 | Park et al. |
| 2012/0174865 A1 | 7/2012 | Choi et al. |

FOREIGN PATENT DOCUMENTS

| | | |
|---|---|---|
| EP | 1 518 940 A1 | 3/2005 |
| JP | 04-272170 | 9/1992 |
| JP | 05-098425 | 4/1993 |
| JP | 2000-068054 A | 3/2000 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2004-043898 A | 2/2004 |
| JP | 2004-091858 A | 3/2004 |
| JP | 2004-103269 A | 4/2004 |
| JP | 2004-103341 A | 4/2004 |
| JP | 2004-107764 | 4/2004 |
| JP | 2004-199919 A | 7/2004 |
| JP | 2004-349101 | 12/2004 |
| JP | 2005-044592 A | 2/2005 |
| JP | 2005-235568 A | 9/2005 |
| JP | 2005-293968 A | 10/2005 |
| JP | 2005-296737 A | 10/2005 |
| JP | 2006-275433 | 10/2006 |
| JP | 2007-047293 | 2/2007 |
| JP | 2008-121098 A | 5/2008 |
| JP | 2008-248301 A2 | 10/2008 |
| JP | 2009-019243 A | 1/2009 |
| JP | 2009-087910 A | 4/2009 |
| KR | 10-2000-0019254 A | 4/2000 |
| KR | 10-1997-0054303 A | 5/2000 |
| KR | 10-2000-0023929 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0090934 A | 12/2002 |
| KR | 10-0405080 | 11/2003 |
| KR | 10-2003-0091947 A | 12/2003 |
| KR | 10-2003-0093959 A | 12/2003 |
| KR | 20-0342433 | 2/2004 |
| KR | 10-2004-0034537 | 4/2004 |
| KR | 2004-0050045 A | 6/2004 |
| KR | 2004-0069281 A | 8/2004 |
| KR | 10-2004-0084747 A | 10/2004 |
| KR | 10-2004-0110718 | 12/2004 |
| KR | 10-0463212 | 12/2004 |
| KR | 10-2005-0018234 | 2/2005 |
| KR | 10-2005-0028943 A | 3/2005 |
| KR | 10-2005-0039140 A | 4/2005 |
| KR | 10-0520159 | 10/2005 |
| KR | 10-0532657 | 12/2005 |
| KR | 10-2006-0008602 A | 1/2006 |
| KR | 10-2006-0018745 A | 3/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0081943 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109561 A | 10/2006 |
| KR | 10-2006-0109627 A | 10/2006 |
| KR | 10-0646160 | 11/2006 |
| KR | 10-0687007 | 2/2007 |
| KR | 10-2007-0025164 A | 3/2007 |
| KR | 10-0696547 B1 | 3/2007 |
| KR | 10-0698033 | 3/2007 |
| KR | 10-0700466 | 3/2007 |
| KR | 10-2007-0035796 A | 4/2007 |
| KR | 10-0711885 | 4/2007 |
| KR | 10-2007-0050793 A | 5/2007 |
| KR | 10-0723627 B1 | 5/2007 |
| KR | 10-0726132 | 6/2007 |
| KR | 10-2007-0078713 A | 8/2007 |
| KR | 10-2007-0080635 A | 8/2007 |
| KR | 10-2007-0098122 A | 10/2007 |
| KR | 10-2007-0101842 A | 10/2007 |
| KR | 10-2007-0105595 A | 10/2007 |
| KR | 10-0770653 B1 | 10/2007 |
| KR | 10-2007-0114094 A | 11/2007 |
| KR | 10-2008-0001184 A | 1/2008 |
| KR | 10-2008-0003720 A | 1/2008 |
| KR | 10-0797787 | 1/2008 |
| KR | 10-0800125 | 1/2008 |
| KR | 10-0815265 | 3/2008 |

(56) References Cited

FOREIGN PATENT DOCUMENTS

| | | |
|---|---|---|
| KR | 10-0823508 B1 | 4/2008 |
| KR | 10-2008-0044775 | 5/2008 |
| KR | 10-0827760 | 5/2008 |
| KR | 10-0839380 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2009-0038733 A | 4/2009 |
| KR | 10-2009-0047953 A | 5/2009 |
| KR | 10-2009-0052828 | 5/2009 |
| KR | 10-2009-0097453 | 9/2009 |
| KR | 10-2010-0119368 A | 11/2010 |
| KR | 10-2010-0126125 | 12/2010 |
| KR | 10-2010-0130786 | 12/2010 |
| KR | 10-2010-0133678 | 12/2010 |
| KR | 10-2011-0022512 | 3/2011 |
| KR | 10-2011-0082418 A | 7/2011 |
| KR | 10-2012-0081811 A | 7/2012 |

OTHER PUBLICATIONS

Ghen, C., et al., "Numerical scale-up study of silicon deposition using 2D slit nozzle sources". Materials Science in Semiconductor Processing, 1 (1998) 141-152.*
KIPO Office action dated Apr. 4, 2012, for Korean Patent application 10-2009-0112796, ( pages).
KIPO Registration Determination Certificate dated Jul. 20, 2012, for Korean Patent application 10-2010-0000897, ( pages).
U.S. Office Action dated Aug. 21, 2013 issued in cross-reference U.S. Appl. No. 12/820,355 (14 pages).
U.S. Office action dated May 16, 2013, for cross reference U.S. Appl. No. 13/235,337, (28 pages).
U.S. Office action dated Apr. 29, 2013, for cross reference U.S. Appl. No. 12/820,355, (31 pages).
English machine translation of Japanese Publication 2004-107764, dated Apr. 8, 2004, (10 pages).
Patent Abstracts of Japan, and English machine translation of Japanese Publication 2004-349101 dated Dec. 9, 2004, (11 pages).
Machine English Translation of JP 2001-052862, 20 pages.
Machine English Translation of JP 2003-003250, 25 pages.
Korean Office action dated Jan. 6, 2012 for corresponding Korean Patent No. 10-2010-0000897, 4 pages.
Korean Office action dated Mar. 21, 2012 for corresponding Korean Patent No. 10-2010-0065465, 5 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for correspodning Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A. dated Sep. 27, 2006, for corresponding Korean Patent No. 10-0687007, 2 pages.
Korean Patent Abstracts, Publication No. 10-2002-0056238 A, dated Jul. 10, 2001, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
Korean Patent Abstracts, Publication No. 10-2001-0050793 A, dated May 16, 2007, for corresponding Korean Patent No. 10-0815265, 2 pages.
Korean Patent Abstracts, Publication No. 10-2001-0042735 A, dated Jul. 7,2001, for corresponding Korean Patent No. 10,0827760, 2 pages.
Korean Patent Abstracts, Publication No. 10-2008-0038650 A, dated May 7, 2008, for corresponding Korean Patent No. 10-0839380, 2 pages.
Korean Patent Abstracts, Publication No. 10-2008-0022592 A, dated Mar. 11, 2008, for corresponding Korean Patent No. 10-2009-0097453, 2 pages.
Korean Patent Abstracts, Publication No. 10-0257219 B1, dated Feb. 29, 2000, for corresponding Korean Patent No. 10-1997-0054303, 2 pages.
Korean Patent Abstracts, Publication No. 10-0532657 B1, dated Dec. 2, 2005, for corresponding Korean Patent No. 10-2004-0043360 A, 2 pages.

* cited by examiner

METHOD OF MANUFACTURING ORGANIC LIGHT-EMITTING DISPLAY APPARATUS BY USING AN ORGANIC LAYER DEPOSITION APPARATUS HAVING STACKED DEPOSITION SOURCES

CROSS-REFERENCE TO RELATED PATENT APPLICATION

This application claims the benefit of Korean Patent Application No. 10-2011-0076990, filed on Aug. 2, 2011, in the Korean Intellectual Property Office, the disclosure of which is incorporated herein in its entirety by reference.

BACKGROUND

1. Field

One or more aspects of the present invention relate to a deposition source assembly, an organic layer deposition apparatus, and a method of manufacturing an organic light-emitting display device by using the organic layer deposition apparatus, and more particularly, to an organic layer deposition apparatus that can be simply applied to the manufacture of large-sized display devices on a mass scale and that improves manufacturing yield, and a method of manufacturing an organic light-emitting display device by using the organic layer deposition apparatus.

2. Description of Related Art

Organic light-emitting display devices have a larger viewing angle, better contrast characteristics, and a faster response rate than other display devices, and thus have drawn attention as next-generation display devices.

Organic light-emitting display apparatuses generally have a stacked structure including an anode, a cathode, and an emission layer interposed between the anode and the cathode. The apparatuses display images in color when holes and electrons, injected respectively from the anode and the cathode, recombine in the emission layer and thus light is emitted. However, it is difficult to achieve high light-emission efficiency just with such a structure, and thus, intermediate layers including an electron injection layer, an electron transport layer, a hole transport layer, a hole injection layer, or the like may be additionally interposed between the emission layer and each of the electrodes.

However, it is very difficult to form organic thin films, such as the emission layer and the intermediate layers, in a fine pattern. Also, the luminous efficiencies of red, green, and blue may vary according to the emission layer and the intermediate layers. Accordingly, it is very difficult to perform patterning of organic thin films in a large area by using a comparable organic layer deposition apparatus. Thus, manufacturing a large-sized organic light-emitting display apparatus having satisfactory driving voltage, current density, brightness, color purity, luminous efficiency, and life-span characteristics is limited. Accordingly, there is an urgent need to solve this patterning problem.

The background technology described above is technical information that the inventor(s) of the present application has achieved to derive the present invention or has achieved during the derivation of the present invention. Thus, it cannot be considered that the background technology has been published to the public before the filing of the present invention.

SUMMARY

Aspects of embodiments of the present invention are directed toward a deposition source assembly and an organic layer deposition apparatus that may be simply applied to produce large-sized display devices on a mass scale, and that improves manufacturing yield and deposition efficiency, and a method of manufacturing an organic light-emitting display apparatus by using the organic layer deposition apparatus.

According to an embodiment of the present invention, there is provided a deposition source assembly including a first deposition source for discharging a deposition material; a second deposition source stacked on the first deposition source, the second deposition source for discharging a different deposition material than the deposition material discharged from the first deposition source; a second deposition source nozzle unit disposed at a side of the second deposition source to face a deposition target, and including a plurality of second deposition source nozzles; and a first deposition source nozzle unit disposed at the side of the second deposition source to face the deposition target, and including a plurality of first deposition source nozzles formed to pass through the second deposition source.

A host material may be discharged from the first deposition source, and a dopant material may be discharged from the second deposition source.

A dopant material may be discharged from the first deposition source, and a host material may be discharged from the second deposition source.

An amount of the host material contained in the first or second deposition source may be greater than that of the dopant material contained in the other deposition source.

Temperature of the second deposition source may be maintained to be higher than temperature of the first deposition source.

The plurality of first deposition source nozzles and the plurality of second deposition source nozzles may be arranged in a line at the side of the second deposition source to face the deposition target, and may be alternately arranged.

The plurality of first deposition source nozzles and the plurality of second deposition source nozzles may be arranged in a line at the side of the second deposition source to face the deposition target, and each of the plurality of first deposition source nozzles may be concentrically included in a corresponding one of the plurality of second deposition source nozzles.

According to another embodiment of the present invention, there is provided an organic layer deposition apparatus for forming an organic layer on a substrate, the apparatus including a deposition source for discharging a deposition material; a deposition source nozzle unit disposed at a side of the deposition source and including a plurality of deposition source nozzles; and a patterning slit sheet disposed facing the deposition source nozzle unit, and including a plurality of patterning slits. The deposition source includes a first deposition source; and a second deposition source stacked on the first deposition source. The deposition source nozzle unit includes a second deposition source nozzle unit disposed at a side of the second deposition source to face the substrate, the second deposition source nozzle unit including a plurality of second deposition source nozzles; and a first deposition source nozzle unit disposed at the side of the second deposition source to face the substrate, the first deposition source nozzle unit including a plurality of first deposition source nozzles formed to pass through the second deposition source. The substrate is disposed apart from the organic layer deposition apparatus by a set distance to be moved relative to the organic layer deposition apparatus.

A host material may be discharged from the first deposition source, and a dopant material may be discharged from the second deposition source.

A dopant material may be discharged from the first deposition source, and a host material may be discharged from the second deposition source.

An amount of the host material contained in the first or second deposition source may be greater than that of the dopant material contained in the other deposition source.

Temperature of the second deposition source may be maintained to be higher than temperature of the first deposition source.

The plurality of first deposition source nozzles and the plurality of second deposition source nozzles may be arranged in a line at the side of the second deposition source to face the substrate, and may be alternately arranged.

The plurality of first deposition source nozzles and the plurality of second deposition source nozzles may be arranged in a line at the side of the second deposition source to face the deposition target, and each of the plurality of first deposition source nozzles may be concentrically included in a corresponding one of the plurality of second deposition source nozzles.

The patterning slit sheet may be smaller than the substrate.

The plurality of first and second deposition source nozzles may be arranged in a first direction. The plurality of patterning slits may be arranged in a second direction perpendicular to the first direction.

The deposition source, the deposition source nozzle unit, and the patterning slit sheet may be integrally formed as one body via connection members.

The connection members may guide movement of the deposition material.

The connection members may be formed to seal a space between the deposition source, the deposition source nozzle unit, and the patterning slit sheet.

The plurality of first and second deposition source nozzles may be arranged in a first direction. The plurality of patterning slits may also be arranged in the first direction. The apparatus may further include a barrier plate assembly including a plurality of barrier plates disposed between the deposition source nozzle unit and the patterning slit sheet in the first direction. The plurality of barrier plates are for partitioning a discharge space between the deposition source nozzle unit and the patterning slit sheet, into a plurality of sub-deposition spaces.

The plurality of barrier plates may extend in a second direction substantially perpendicular to the first direction.

The barrier plate assembly may include a first barrier plate assembly including a plurality of first barrier plates; and a second barrier plate assembly including a plurality of second barrier plates.

The plurality of first barrier plates and the plurality of second barrier plates may extend in a second direction substantially perpendicular to the first direction, in order to partition the deposition space between the deposition source nozzle unit and the patterning slit sheet, into the plurality of sub-deposition spaces.

The organic layer deposition apparatus may further include a chamber. The plurality of first and second deposition source nozzles may be arranged in a first direction. The patterning slit sheet may be fixedly combined with an inner side of the chamber, and the plurality of patterning slits may be arranged in a second direction perpendicular to the first direction.

The apparatus may further include a first conveyor unit for moving an electrostatic chuck fixed with the substrate in the first direction.

The first conveyor unit may include a frame in which the deposition source is disposed; and a sheet support unit formed to protrude from an inner side surface of the frame, and supporting the patterning slit sheet.

According to another embodiment of the present invention, there is provided a method of manufacturing an organic light-emitting display apparatus, the method including disposing an organic layer deposition apparatus to be apart from a substrate, which is a deposition target, by a set distance. The organic light-emitting display apparatus includes a deposition source for discharging a deposition material; a deposition source nozzle unit disposed at a side of the deposition source and including a plurality of deposition source nozzles; and a patterning slit sheet disposed to face the deposition source nozzle unit and including a plurality of patterning slits. The deposition source includes a first deposition source; and a second deposition source stacked on the first deposition source. The deposition source nozzle unit includes a second deposition source nozzle unit disposed at a side of the second deposition source to face the substrate, the second deposition source nozzle unit including a plurality of second deposition source nozzles; and a first deposition source nozzle unit disposed at the side of the second deposition source to face the substrate, the first deposition source nozzle unit including a plurality of first deposition source nozzles formed to pass through the second deposition source. The deposition material is deposited on the substrate while the organic layer deposition apparatus or the substrate is moved relative to the other.

A host material may be discharged from the first deposition source, and a dopant material may be discharged from the second deposition source.

A dopant material may be discharged from the first deposition source, and a host material may be discharged from the second deposition source.

An amount of the host material contained in the first or second deposition source may be greater than that of the dopant material contained in the other deposition source.

Temperature of the second deposition source may be maintained to be higher than temperature of the first deposition source.

The plurality of first deposition source nozzles and the plurality of second deposition source nozzles may be arranged in a line at the side of the second deposition source to face the substrate, and may be alternately arranged.

The plurality of first deposition source nozzles and the plurality of second deposition source nozzles may be arranged in a line at the side of the second deposition source to face the substrate, and each of the plurality of first deposition source nozzles may be concentrically included in one of the plurality of second deposition source nozzles.

The patterning slit sheet may be smaller than the substrate.

The plurality of first and second deposition source nozzles may be arranged in a first direction, and the patterning slits arranged in a second direction perpendicular to the first direction.

The plurality of first and second deposition source nozzles may be arranged in a first direction. The plurality of patterning slits may be arranged in the first direction. The apparatus may further include a barrier plate assembly including a plurality of barrier plates disposed between the deposition source nozzle unit and the patterning slit sheet in the first direction. The plurality of barrier plates are for partitioning a deposition space between the deposition source nozzle unit and the patterning slit sheet, into a plurality of sub-deposition spaces.

The organic layer deposition apparatus may further include a chamber. The plurality of first and second deposition source nozzles may be arranged in a first direction. The patterning slit sheet may be fixedly combined with an inner side of the chamber, and the plurality of patterning slits may be arranged in a second direction perpendicular to the first direction.

According to another embodiment of the present invention, there is provided an organic light-emitting display apparatus manufactured using the organic layer deposition apparatus.

BRIEF DESCRIPTION OF THE DRAWINGS

The above and other features of the present invention will become more apparent by describing in detail exemplary embodiments thereof with reference to the attached drawings in which.

DETAILED DESCRIPTION

Hereinafter, exemplary embodiments of the present invention will be described in greater detail with reference to the accompanying drawings so that those of ordinary skill in the art may easily accomplish them. The present invention may be embodied in various forms and is thus not limited to the embodiments set forth herein.

Figure 1:
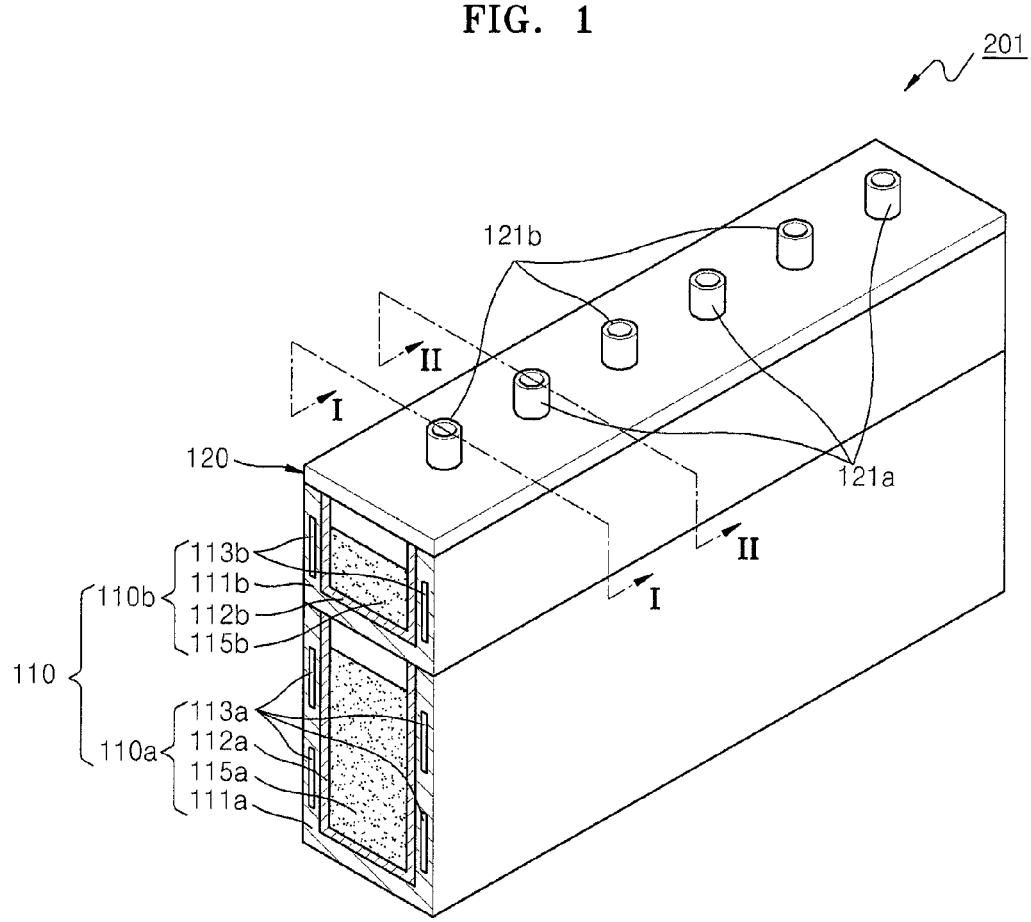
FIG. 1 is a schematic perspective cutaway view of a deposition source assembly according to an embodiment of the present invention.
Figure 2A:
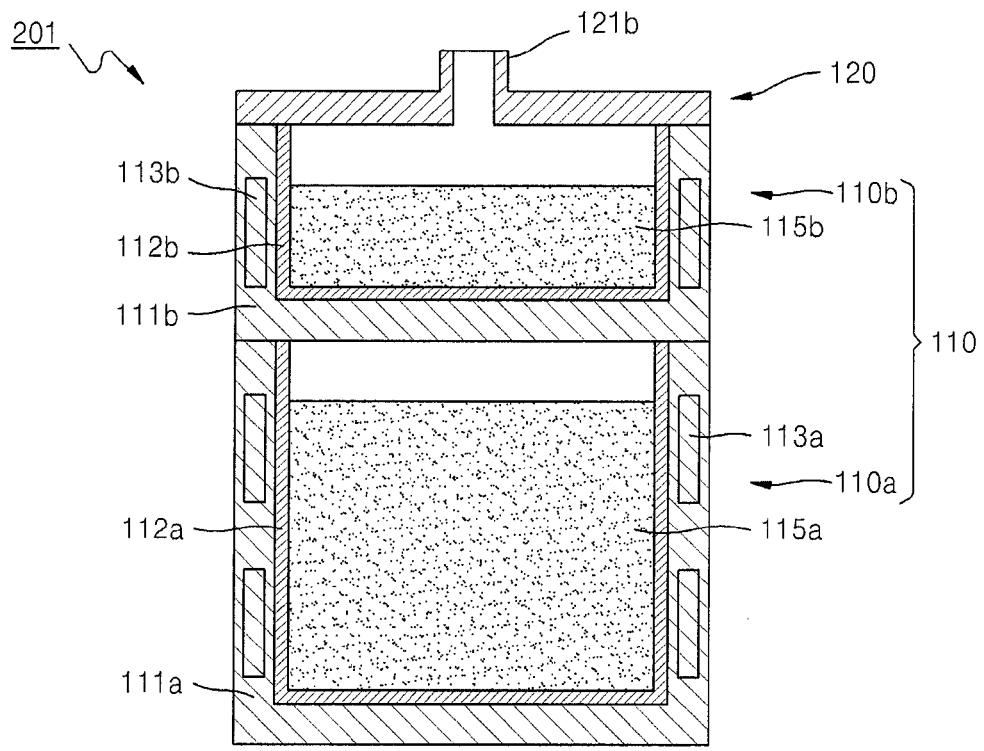
FIGS. 2A and 2B are schematic sectional side views of the deposition source assembly of FIG. 1, according to embodiments of the present invention.
Figure 2B:
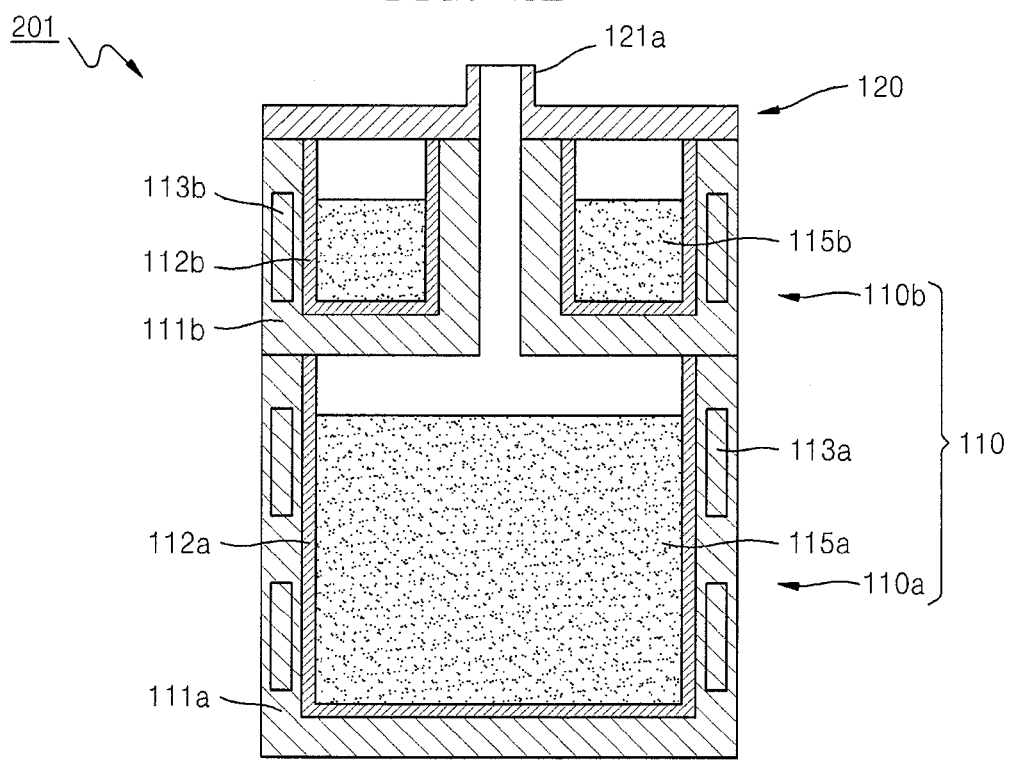
Figure 3:
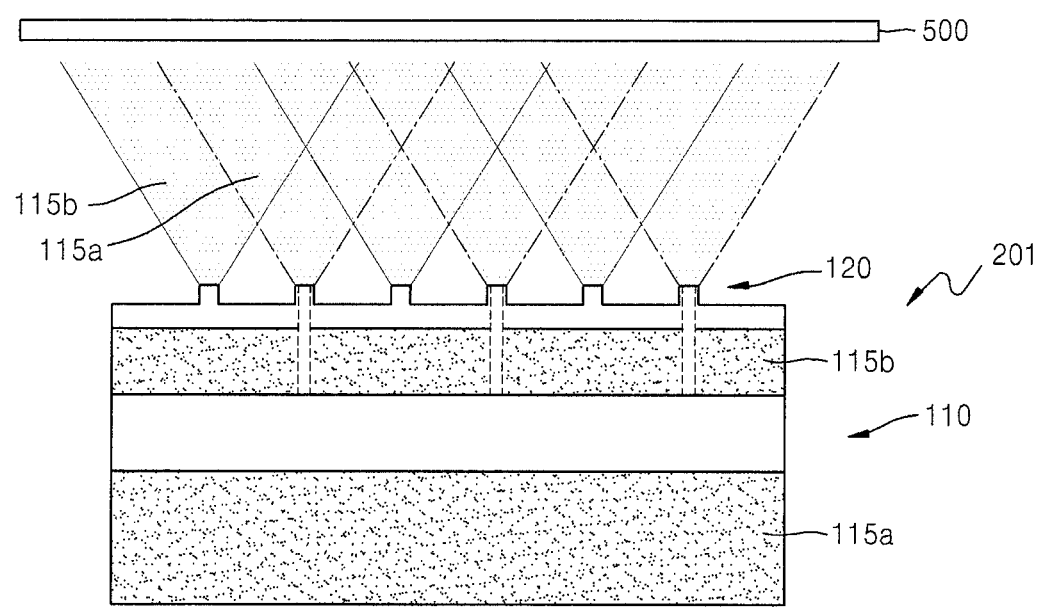
FIG. 3 is a schematic sectional view illustrating an operation of the deposition source assembly of FIG. 1, according to another embodiment of the present invention.

FIG. 1 is a schematic perspective cutaway view of a deposition source assembly 201 according to an embodiment of the present invention. FIG. 2A is a sectional side view taken along the line I-I of FIG. 1. FIG. 2B is a sectional side view taken along the line II-II of FIG. 1. FIG. 3 is a schematic sectional view illustrating an operation of the deposition source assembly 201 of FIG. 1, according to another embodiment of the present invention.

Referring to FIGS. 1 to 2B, the deposition source assembly 201 includes a deposition source 110 and a deposition source nozzle unit 120.

The deposition source 110 may include a first deposition source 110a and a second deposition source 110b. The first deposition source 110a and the second deposition source 110b vaporize deposition materials 115a and 115b to form a thin film on a deposition target (a substrate 500 illustrated in FIG. 3), respectively.

Specifically, the first deposition source 110a may contain a host material as the deposition material 115a, and the second deposition source 110b may contain a dopant material as the deposition material 115b. Since the host material 115a and the dopant material 115b are vaporized at different temperatures, a plurality of deposition sources and a plurality of nozzle units may be used to concurrently or simultaneously deposit the host material 115a and the dopant material 115b.

Examples of the host material 115a may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene(BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like.

Examples of the dopant material 115b may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), or the like.

In the current embodiment, an amount of the host material 115a is greater than that of the dopant material 115b. Although a content of the dopant material 115b may vary depending on a material used to form thin films, the dopant material 115b may be included at about 3 to about 20 parts by weight in the thin film forming material (total weight of the host and dopant materials 115a and 115b) of 100 parts by weight. In one embodiment, if the content of the dopant material 117b exceeds the above described range, the luminous characteristics of an organic light-emitting display apparatus are degraded. Thus, the size of the first deposition source 110a containing the host material 115a is greater than that of the second deposition source 110b containing the dopant material 115b.

The first deposition source 110a and the second deposition source 110b are disposed in the vertical direction. In other words, the second deposition source 110b is stacked on the first deposition source 110a. FIGS. 1 to 2B illustrate that the host material 115a is contained in the first deposition source 110a, but aspects of the present invention are not limited thereto and the host material 115a may be contained in the second deposition source 110b. However, in this case, the size of the second deposition source 110b should be greater than that of the first deposition source 110a, unlike in FIGS. 1 to 2B.

Comparably, in another embodiment, the first deposition source 110a and the second deposition source 110b are horizontally disposed in a line, and thus, the host material 115a and the dopant material 115b are not evenly deposited. In other words, a region on which the host material 115a and the dopant material 115b are discharged to overlap with each other is small, and particularly, edges of this region are likely to be coated with only the host material 115a or the dopant material 115b, thereby degrading doping uniformity. However, in the embodiment shown in FIGS. 1 to 2B, since the first and second deposition sources 110a and 110b are vertically disposed in the deposition source 110 of FIG. 1, the host material 115a and the dopant material 115b may be evenly discharged on a desired region, thereby ensuring or guaranteeing doping uniformity.

Specifically, the first deposition source 110a includes a crucible 112a filled with the host material 115a, and a heater 113a that heats the crucible 112a to vaporize the host material 115a towards a side (e.g., an upper side) of the crucible 112a, and in particular, towards the deposition target. The heater 113a is included in a cooling block 111a wrapping or covering the crucible 112a, and the cooling block 111a protects or prevents radiation of heat from the crucible 112a to the outside, e.g., to a chamber (not shown). Similarly, the second deposition source 110b includes a crucible 112b filled with the dopant material 115b, and a heater 113b that heats the crucible 112b to vaporize the dopant material 115b towards a side of the crucible 112b, and in particular, towards the deposition target. The heater 113b is included in a cooling block 111b wrapping or covering the crucible 112b.

The second deposition source 110b disposed on the first deposition source 110a is maintained at a higher temperature than the first deposition source 110a. In other words, a material vaporized at a relatively high temperature is contained in the second deposition source 110b, and a material vaporized at a relatively low temperature is contained in the first deposition source 110a below the second deposition source 110b. This is because deposition source nozzles of the first deposition source 110a are formed to pass through the second deposition source 110b on the first deposition source 110a. Thus, when the temperature of the second deposition source 110b is low, a deposition material in the deposition source nozzles of the first deposition source 110a may be changed into a solid state and block the deposition source nozzles. Thus, the intensity of heat generated by the heater 113b included in the second deposition source 110b should be higher than that of heat generated by the heater 113a included in the first deposition source 110a.

The deposition source nozzle unit 120 is disposed at a side of the second deposition source 110b, and in particular, at the side of the second deposition source 110b facing the deposition target (the substrate 500 of FIG. 3). Specifically, since the first deposition source 110a is disposed below the second deposition source 110b, a first deposition source nozzle unit including a plurality of first deposition source nozzles 121a passes through the second deposition source 110b and is positioned at a side of the second deposition source 110b, and particularly, the side of the second deposition source 110b facing the deposition target. A second deposition source unit including a plurality of second deposition source nozzles 121b is also positioned at the side of the second deposition source 110b. The deposition source nozzle unit 120 includes the plurality of first deposition source nozzles 121a and the plurality of second deposition source nozzles 121b. The plurality of first deposition source nozzles 121a and the plurality of second deposition source nozzles 121b are passages via which the host and dopant materials 115a and 115b contained in the crucibles 112a and 112b are discharged toward the deposition target. Thus, the plurality of first deposition source nozzles 121a and the plurality of second deposition source nozzles 121b are formed to respectively extend from the first deposition source 110a and the second deposition source 110b toward the deposition target.

In the current embodiment, the plurality of first deposition nozzles 121a and the plurality of second deposition source nozzles 121b are arranged in a line at the side of the second deposition source 110b facing the deposition target. Referring to FIGS. 2A and 2B, the plurality of first deposition source nozzles 121a and the plurality of second deposition source nozzles 121b are alternately arranged so that the host material 115a and the dopant material 115b may be evenly deposited in a set or predetermined discharge region.

Through the above described structure, the mixing ratio of the host material 115a and the dopant material 115b may be constant throughout the entire substrate 500, as illustrated in FIG. 3. If a thin film is formed by using a mixture in which the host material 115a and the dopant material 115b are mixed in a constant mixture ratio, the thin film may exhibit improved characteristics in view of color coordinates, luminous efficiency, driving voltage, and lifespan.

Figure 4:
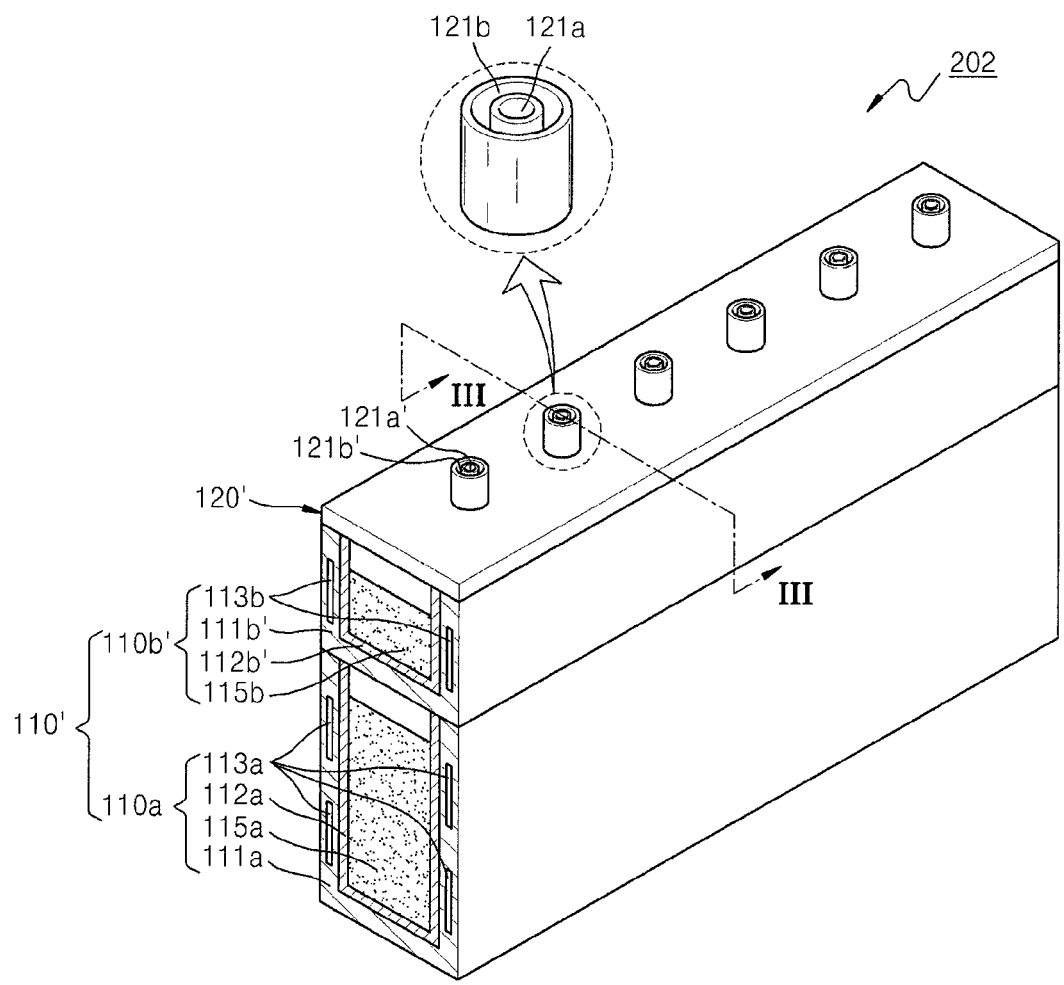
FIG. 4 is a schematic perspective cutaway view of a deposition source assembly according to another embodiment of the present invention.
Figure 5:
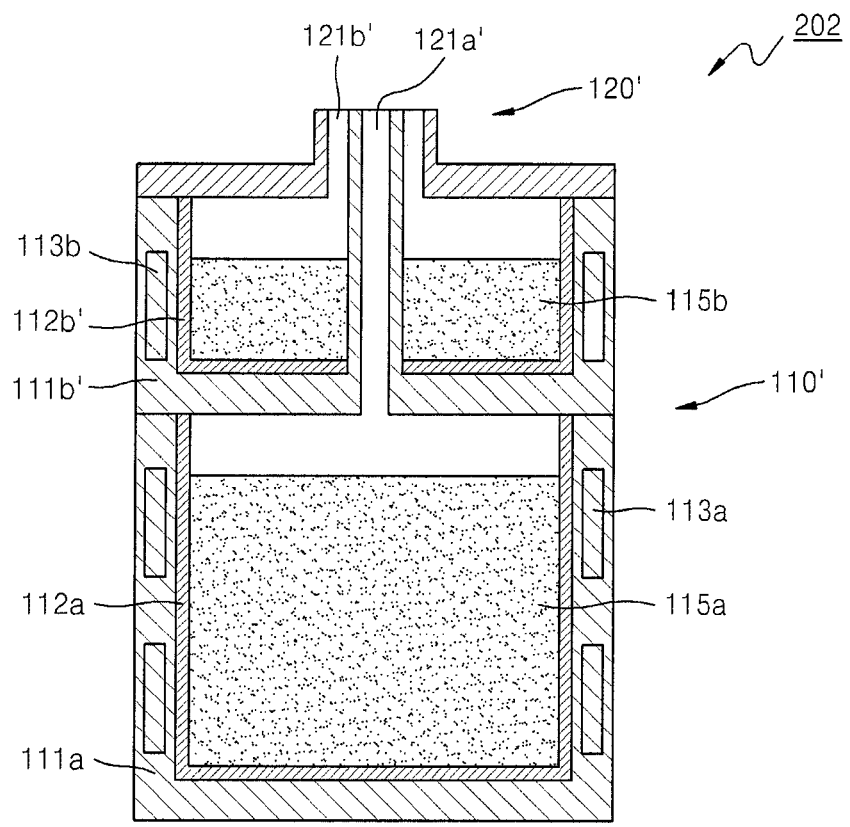
FIG. 5 is a schematic sectional side view of the deposition source assembly of FIG. 4.
Figure 6:
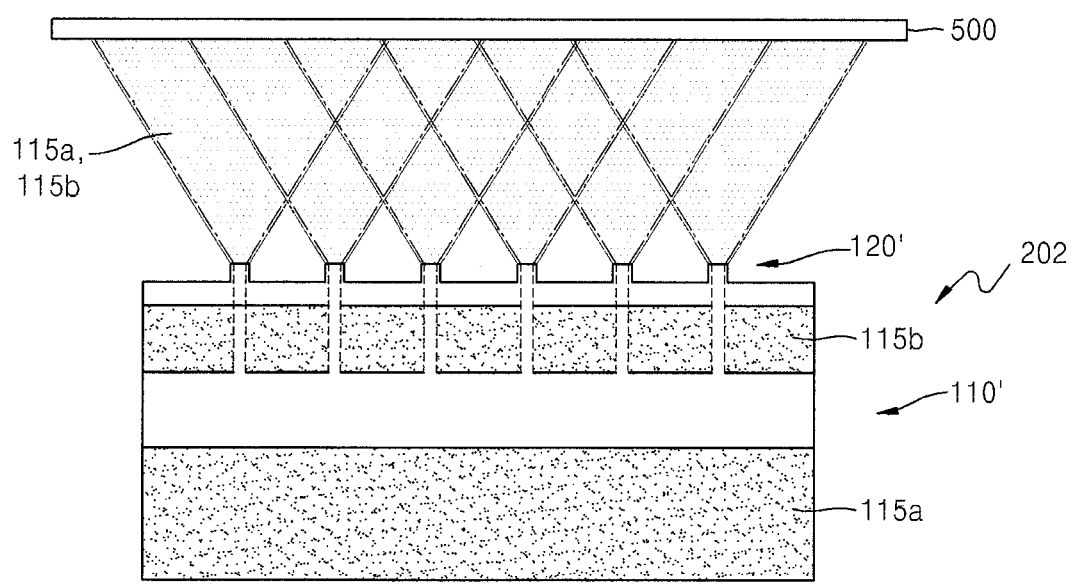
FIG. 6 is a schematic sectional view illustrating an operation of the deposition source assembly of FIG. 4, according to another embodiment of the present invention.

FIG. 4 is a schematic perspective cutaway view of a deposition source assembly 202 according to another embodiment of the present invention. FIG. 5 is a sectional side view taken along the line III-II of FIG. 4. FIG. 6 is a schematic sectional view of the deposition source assembly 202 of FIG. 4, according to another embodiment of the present invention.

Referring to FIGS. 4 to 6, a deposition source 110' has the same structure as the deposition source 110 included in the deposition source assembly 201 of FIG. 1, except for shapes and arrangement of a plurality of nozzles included in a deposition source nozzle unit 120'. In other words, in the deposition source assembly 202 of FIG. 4, a plurality of first deposition nozzles 121a' and a plurality of second deposition source nozzles 121b' are arranged in a line at the side of a second deposition source 110b' facing a deposition target and including a crucible 112b' and a cooling block 111b'. Also, referring to FIG. 5, each of the plurality of first deposition source nozzles 121a' is concentrically disposed in one of the plurality of second deposition source nozzles 121b'. Referring to FIG. 6, a first region (on which a host material 115a is discharged) and a second region (on which a dopant material 115b is discharged) are large. Thus, the host material 115a and the dopant material 115b may be more evenly deposited when using the deposition source assembly 202 than when using the deposition source assembly 201 of FIG. 1. The other elements of the deposition source assembly 202 are the same as or similar to those of the deposition source assembly 201 of FIG. 1 in terms of their operations and structures, and are thus not described here.

Figure 7:
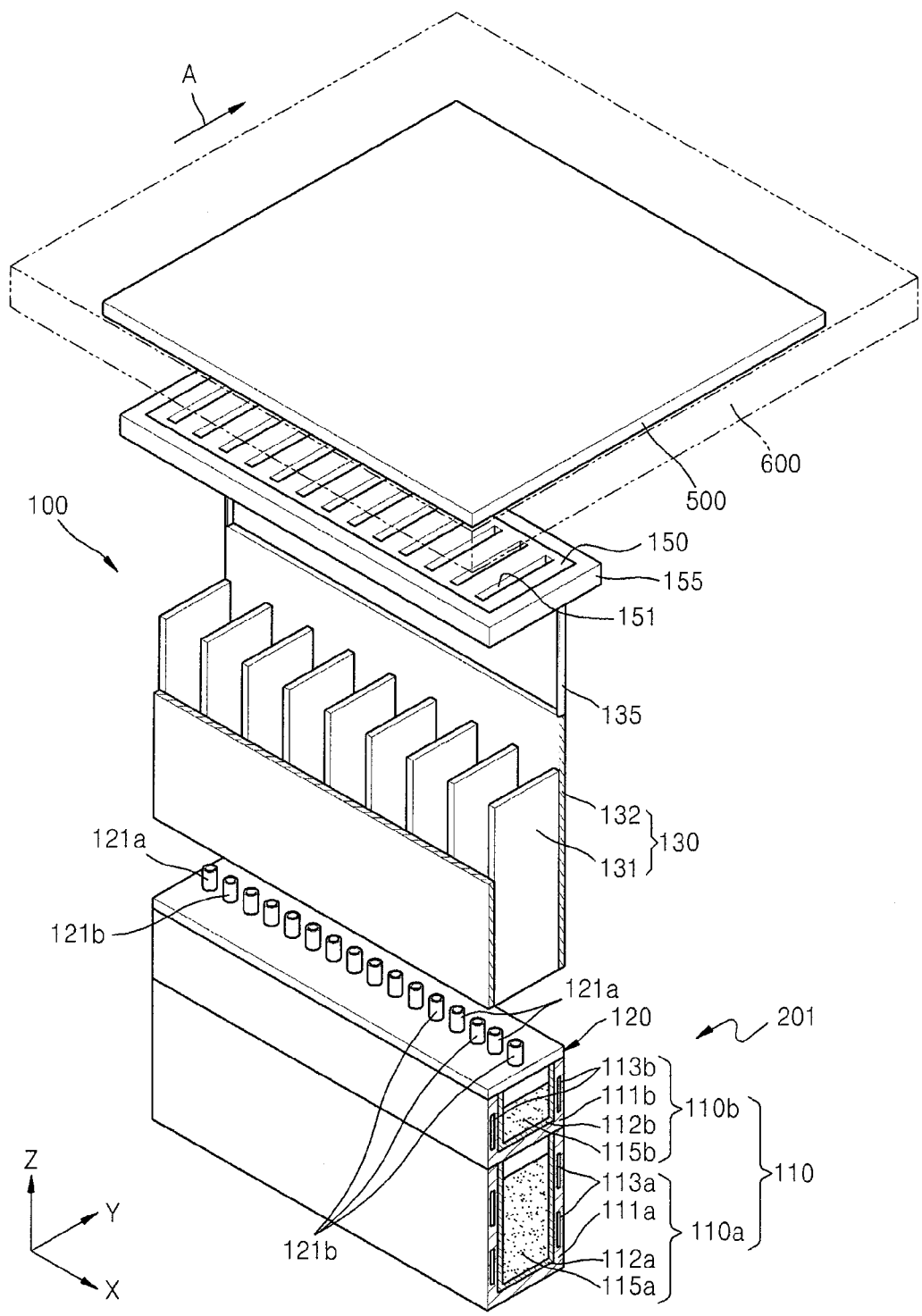
FIG. 7 is a schematic perspective cutaway view of an organic layer deposition assembly included in an organic layer deposition apparatus, according to an embodiment of the present invention.
Figure 8:
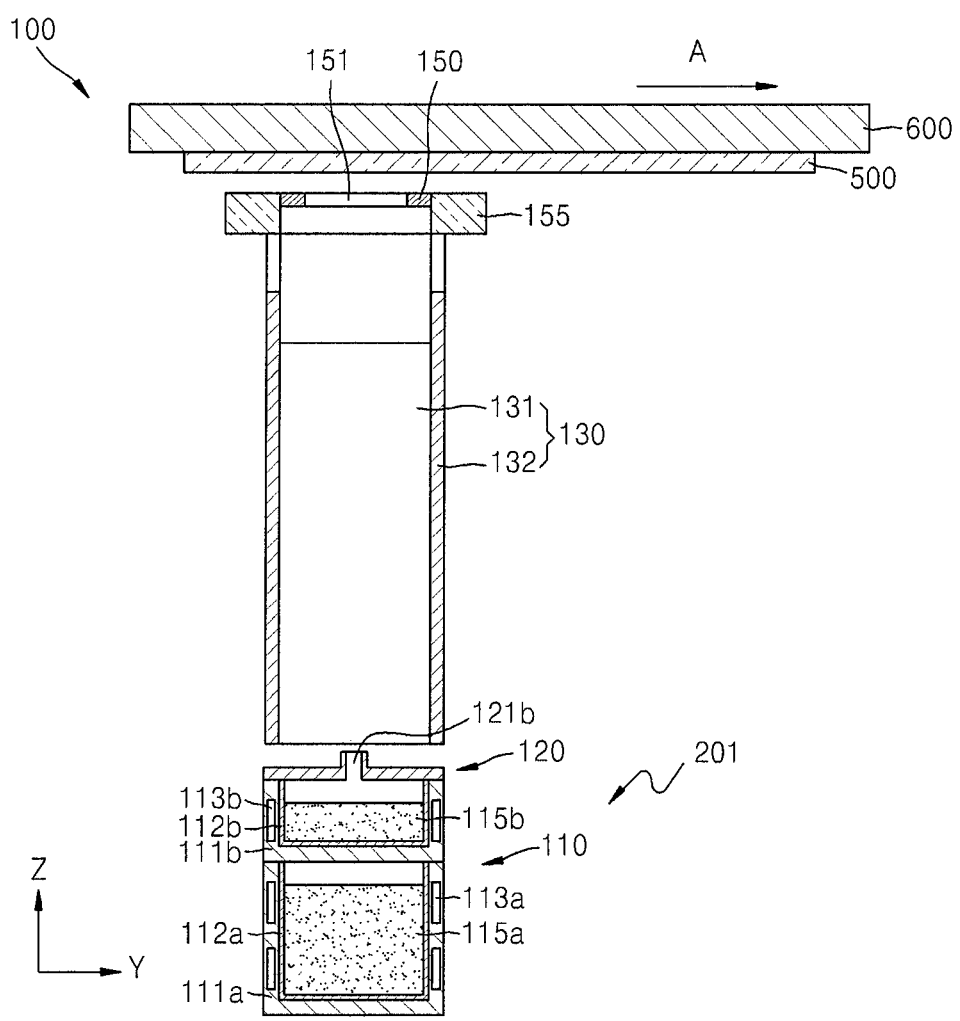
FIG. 8 is a schematic sectional side view of the organic layer deposition assembly of FIG. 7.
Figure 9:
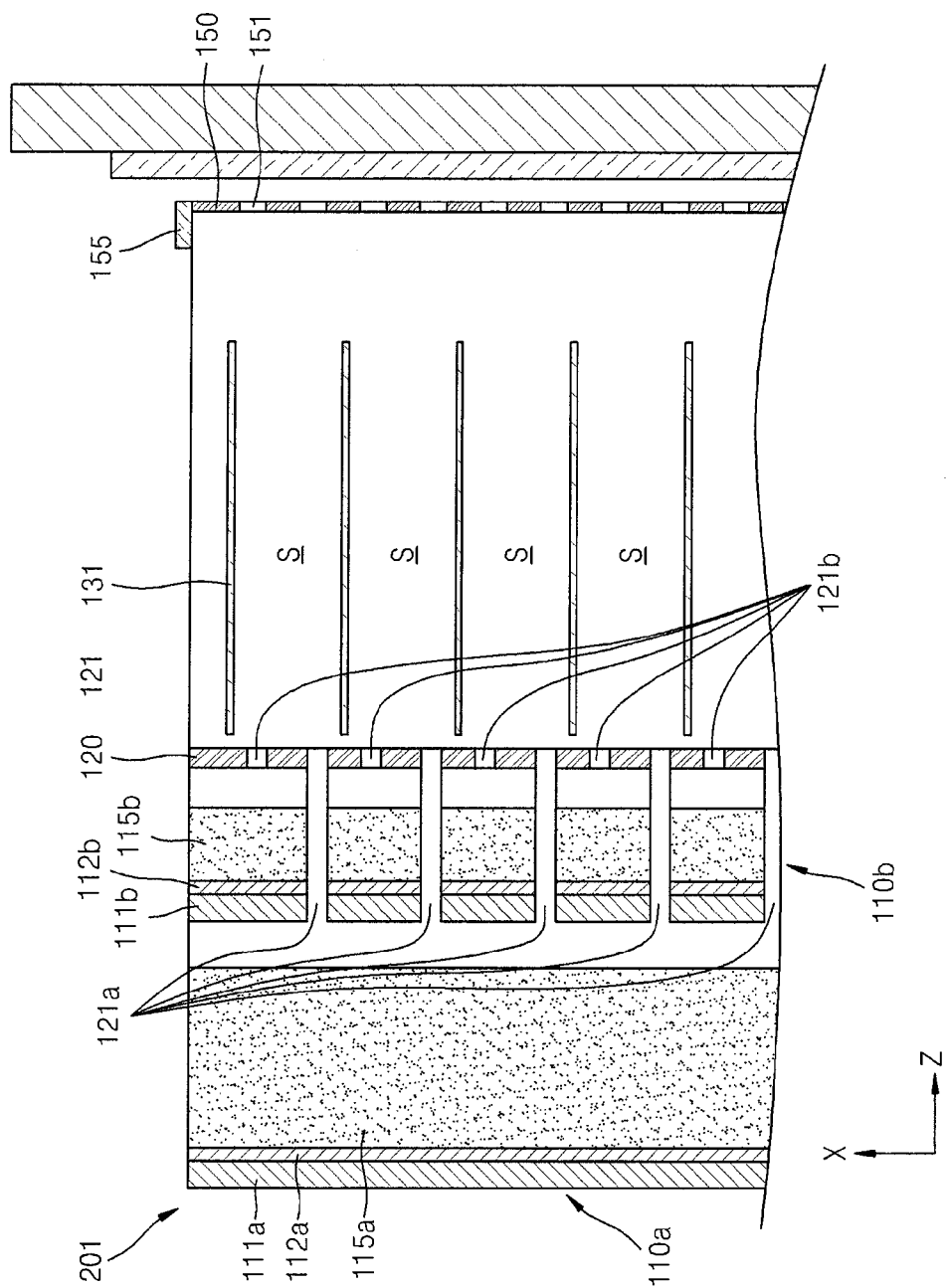
FIG. 9 is a schematic sectional plan view of the organic layer deposition assembly of FIG. 7.

An organic layer deposition assembly of an organic layer deposition apparatus according to an embodiment of the present invention is described below. FIG. 7 is a schematic perspective cutaway view of an organic layer deposition assembly 100 of an organic layer deposition apparatus according to an embodiment of the present invention. FIG. 8 is a schematic sectional side view of the organic layer deposition assembly of FIG. 7. FIG. 9 is a schematic sectional plan view of the organic layer deposition assembly 100 of FIG. 7.

The organic layer deposition assembly 100 is included in a deposition unit (not shown) of the organic layer deposition apparatus. Although not shown, the deposition unit may include a plurality of deposition chambers, and a plurality of organic layer deposition assemblies 100 may be respectively disposed in the plurality of deposition chambers. The total number of organic layer deposition assemblies 100 may vary according to a deposition material and deposition conditions. Each of the deposition chambers is maintained in a vacuum state during a deposition process. A substrate 500 which is a deposition target may be fixed on an electrostatic chuck 600 and then be transferred together with the electrostatic chuck 600 to a deposition chamber.

Referring to FIGS. 7 to 9, the organic layer deposition assembly 100 includes a deposition source assembly 201, a barrier plate assembly 130, and a patterning slit sheet 150.

Although a chamber is not illustrated in FIGS. 7 through 9 for convenience of explanation, all the components of the organic layer deposition assembly 100 may be disposed within the chamber that is maintained at an appropriate degree of vacuum. The chamber is maintained at an appropriate vacuum in order to allow a host material 115a and a dopant material 115b to move in a substantially straight line through the organic layer deposition assembly 100.

In the chamber, the substrate 500 that is a deposition target is transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In the current embodiment, the substrate 500 may be moved relative to the organic layer deposition assembly 100. For example, as illustrated in FIG. 7, the substrate 500 may be moved in a direction of an arrow A, relative to the organic layer deposition assembly 100.

In a comparable deposition method using a fine metal mask (FMM), the size of the FMM has to be greater than or equal to the size of a substrate. Thus, the size of the FMM has to be increased as the substrate becomes larger. However, it is neither straightforward to manufacture a large FMM nor to extend an FMM to be accurately aligned with a fine pattern.

In order to overcome this problem, in the organic layer deposition assembly 100, deposition may be performed while the organic layer deposition assembly 100 or the substrate 500 is moved relative to the other. In other words, deposition may be continuously performed while the substrate 500, which is disposed such as to face the organic layer deposition assembly 100, is moved in a Y-axis direction. In other words, deposition may be performed in a scanning manner while the substrate 500 is moved in the direction of arrow A in FIG. 7. Although the substrate 500 is illustrated as being moved in the Y-axis direction in FIG. 7 when deposition is performed, aspects of the present invention are not limited thereto. For example, deposition may be performed while the organic layer deposition assembly 100 is moved in the Y-axis direction, whereas the substrate 500 is fixed.

Thus, in the organic layer deposition assembly 100 according to the current embodiment, the patterning slit sheet 150 may be significantly smaller than an FMM used in the comparable deposition method. That is, in the organic layer deposition assembly 100, deposition is continuously performed, i.e., in a scanning manner, while the substrate 500 is moved in the Y-axis direction. Thus, a length of the patterning slit sheet 150 in the Y-axis direction may be significantly less than a length of the substrate 500, provided a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in a scanning manner while the substrate 500 or the organic layer deposition assembly 100 is moved relative to the other.

As described above, since the patterning slit sheet 150 may be formed to be significantly smaller than an FMM used in the comparable deposition method, it is relatively easy to manufacture the patterning slit sheet 150 used in the present invention. In other words, using the patterning slit sheet 150, which is smaller than the FMM used in the conventional deposition method, is more convenient in all processes, including etching and other subsequent processes, such as precise extension, welding, moving, and cleaning processes, compared to the comparable deposition method using the larger FMM. This is more advantageous for a relatively large display apparatus.

In order to perform deposition while the organic layer deposition assembly 100 or the substrate 500 is moved relative to the other as described above, the organic layer deposition assembly 100 and the substrate 500 may be separated from each other by a set or predetermined distance. This will be described later in detail.

The deposition source assembly 201 that contains and heats the host material 115a and the dopant material 115b, is disposed at an opposite side of the chamber to a side at which the substrate 500 is disposed. Although the organic layer deposition assembly 100 of FIG. 7 employs the deposition source assembly 201 illustrated in FIG. 1, aspects of the present invention are not limited thereto and the deposition source assembly 202 illustrated in FIG. 4 may be used.

As described above, and referring to FIG. 12, a deposition source 110 includes a first deposition source 110a, and a second deposition source 110b disposed on the first deposition source 110a. The first deposition source 110a includes a crucible 112a filled with a host material 115a, and a heater 113a that heats the crucible 112a. The second deposition source 110b includes a crucible 112b filled with a dopant material 115b, and a heater 113b that heats the crucible 112b. To smoothly discharge the host material 115a and the dopant material 115b, the temperature of the second deposition source 110b on the first deposition source 110a is maintained to be higher than that of the first deposition source 110a. Although each of the host material 115a and the dopant material 115b may be included in any of the first and second deposition sources 110a and 110b, the amount of the host material 115a should be greater than that of the dopant material 115b, and thus, the size of a deposition source containing the host material 115a should be greater than that of a deposition source containing the dopant material 115b.

As described above, a deposition source nozzle unit 120 is disposed at a side of the deposition source 110, and in particular, at a side of the second deposition source 110b facing the substrate 500. The deposition source nozzle unit 120 includes a plurality of first deposition source nozzles 121a and a plurality of second deposition sources 121a arranged in the X-axis direction. The deposition source nozzle unit 120 includes a first deposition source nozzle unit including the plurality of first deposition source nozzles 121a, and a second deposition source nozzle unit including the plurality of second deposition source nozzles 121b. The plurality of first deposition source nozzles 121a pass through the second deposition source 110b and are positioned at a side of the second deposition source 110b. The plurality of first deposition source nozzles 121a and the plurality of second deposition source nozzles 121b are alternately disposed. Thus, the host material 115a and the dopant material 115b may be evenly deposited on a predetermined discharge region.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. Each of the barrier plates 131 may be arranged parallel to an YZ plane in FIG. 7, and may have a rectangular shape. The plurality of barrier plates 131 arranged as described above partition a deposition space between the deposition source nozzle unit 120 and the patterning slit sheet 150, into a plurality of sub-deposition spaces S. Referring to FIG. 9, in the organic layer deposition assembly 100, the deposition space is divided by the barrier plates 131 into the sub-deposition spaces S that respectively correspond to a plurality of pairs of the first and second deposition source nozzles 121a and 121b through which the host material 115a and the dopant material 115b are discharged.

The barrier plates 131 may be respectively disposed between adjacent pairs of the first and second deposition source nozzles 121a and 121b. In other words, one of the plurality of first deposition source nozzles 121a for discharging the host material 115a and one of the plurality of second deposition source nozzles 121b for discharging the dopant material 115b are disposed as one group between two adjacent barrier plates 131. The pairs of the first and second deposition source nozzles 121a and 121b may be respectively located at the midpoint between two adjacent barrier plates 131. However, aspects of the present invention are not limited to this structure, and pairs of the first and second deposition source nozzles 121a and 121b may be disposed between two adjacent barrier plates 131. In this case, the pairs of first and second deposition source nozzles 121a and 121b may be also located at the midpoint between two adjacent barrier plates 131.

As described above, since the barrier walls 131 partition the deposition space between the deposition source nozzle unit 120 and the patterning slit sheet 150 into the plurality of sub-deposition spaces S, the host material 115a and the dopant material 115s discharged through one of the pairs of first and second deposition source nozzles 121a and 121b, are not mixed with the host material 115a and the dopant material 115s discharged through the other pairs of first and second deposition source nozzles 121a and 121b, and pass through patterning slits 151 to be deposited on the substrate 500. In other words, the barrier plates 131 guide the host material 115a and the dopant material 115b, which are discharged through the pairs of first and second deposition source nozzles 121a and 121b, to move straight in the Z-axis direction, not to flow in the X-axis direction.

As described above, the host material 115a and the dopant material 115b are forced to move straight by installing the barrier plates 131, so that a smaller shadow zone may be formed on the substrate 500 compared to a case where no barrier plates are installed. Thus, the organic layer deposition assembly 100 and the substrate 500 may be separated from each other by a set or predetermined distance. This will be described later in detail.

The patterning slit sheet 150 and a frame 155 are disposed between the deposition source 110 and the substrate 500. The shape of the frame 155 may be similar to a window frame. The patterning slit sheet 150 is bound inside the frame 155. The patterning slit sheet 150 includes the plurality of patterning slits 151 arranged in the X-axis direction. The patterning slits 151 extend in the Y-axis direction. The host material 115 and the dopant material 115b that are vaporized in the deposition source 110 and pass through the pairs of first and second deposition source nozzles 121a and 121b, pass through the patterning slits 151 towards the substrate 500.

The patterning slit sheet 150 may be formed of a metal thin film. The patterning slit sheet 150 is fixed to the frame 155 such that a tensile force is exerted thereon. The patterning slits 151 may be formed by etching the patterning slit sheet 150 to a stripe pattern. The number of patterning slits 151 may be equal to the number of deposition patterns to be formed on the substrate 500.

The barrier plate assembly 130 and the patterning slit sheet 150 may be disposed apart from each other by a set or predetermined distance. Alternatively, the barrier plate assembly 130 and the patterning slit sheet 150 may be connected via connection members 135.

As described above, the organic layer deposition assembly 100 according to the current embodiment performs deposition while being moved relative to the substrate 500. In order to move the organic layer deposition assembly 100 relative to the substrate 500, the patterning slit sheet 150 is disposed apart from the substrate 500 by a set or predetermined distance. In addition, in order to prevent (or protect from) formation of a relatively large shadow zone on the substrate 500 when the patterning slit sheet 150 and the substrate 500 are disposed apart from each other, the barrier plates 131 are arranged between the deposition source nozzle unit 120 and the patterning slit sheet 150 to force the host material 115a and the dopant material 115b to move in a straight direction. Thus, the size of a shadow zone that may be formed on the substrate 500 may be sharply reduced.

In a comparable deposition method using an FMM, deposition is performed with the FMM in close contact with a substrate in order to prevent (or protect from) formation of a shadow zone on the substrate. However, when the FMM is used in close contact with the substrate, the contact may cause defects, such as scratches on patterns formed on the substrate. In addition, in the comparable deposition method, the size of the mask has to be the same as the size of the substrate since the mask cannot be moved relative to the substrate. Thus, the size of a mask has to be increased as display apparatuses become larger. However, it is not easy to manufacture such a large mask.

In order to overcome this problem, in the organic layer deposition assembly 100 according to the current embodiment, the patterning slit sheet 150 is disposed apart from the substrate 500 by a set or predetermined distance. This may be facilitated by installing the barrier plates 131 to reduce the size of a shadow zone to be formed on the substrate 500.

A thin film, such as an organic layer, may be formed to manufacture an organic light-emitting display apparatus by using an organic layer deposition apparatus as described above. This is described in detail with reference to FIG. 14 below.

Figure 10:
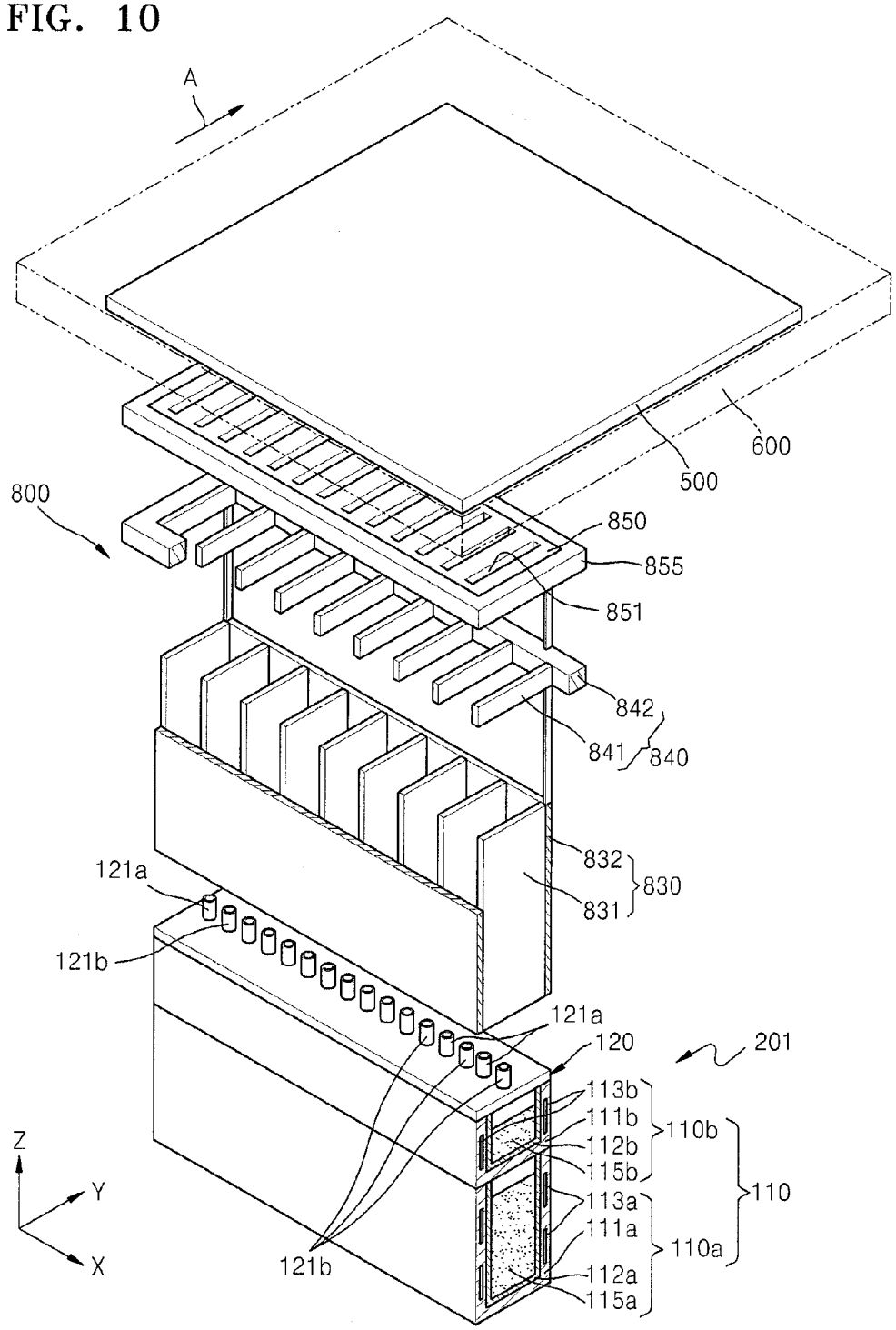
FIG. 10 is a schematic perspective cutaway view of an organic layer deposition assembly according to another embodiment of the present invention.

FIG. 10 is a schematic perspective cutaway view of an organic layer deposition assembly 800 according to another embodiment of the present invention. Referring to FIG. 10, the organic layer deposition assembly 800 includes a deposition source assembly 210, a first barrier plate assembly 830, a second barrier plate assembly 840, and a patterning slit sheet 850. The deposition source assembly 210, the first barrier plate assembly 830, and the patterning slit sheet 850 have the same structures as those in the previous embodiment described above with reference to FIG. 7, and thus, a detailed description thereof will not be provided here. The organic layer deposition assembly 800 according to the current embodiment is different from the organic layer deposition assembly 100 of FIG. 7 according to the previous embodiment, in that the second barrier plate assembly 840 is disposed at a side of the first barrier plate assembly 830.

Specifically, the second barrier plate assembly 840 includes a plurality of second barrier plates 841, and a second barrier plate frame 841 that covers sides of the plurality of second barrier plates 841. The plurality of second barrier plates 841 may be arranged parallel to each other at equal intervals in the X-axis direction.

In addition, each of the plurality of second barrier plates 841 may be formed to extend in an YZ plane in FIG. 10, i.e., perpendicular to the X-axis direction.

The plurality of first barrier plates 831 and the plurality of second barrier plates 841 arranged as described above partition a deposition space between the deposition source nozzle unit 120 and the patterning slit sheet 850. In other words, the deposition space is divided by the plurality of first barrier plates 831 and the plurality of second barrier plates 841 into sub-deposition spaces that respectively correspond to pairs of first and second deposition source nozzles 121*a* and 121*b* through which a host material 115*a* and a dopant material 115*b* are discharged.

The plurality of second barrier plates 841 may be disposed to respectively correspond to the plurality of first barrier plates 831. In other words, the plurality of second barrier plates 841 may be aligned with respect to the plurality of first barrier plates 831, respectively. That is, each pair of the corresponding first and second barrier plates 831 and 841 may be located on the same plane. The plurality of first barrier plates 831 and the plurality of second barrier plates 841 are respectively illustrated as having the same thickness in the X-axis direction, but aspects of the present invention are not limited thereto. In other words, the second barrier plates 841, which need to be accurately aligned with patterning slits 851, may be formed to be relatively thin, whereas the first barrier plates 831, which do not need to be precisely aligned with the patterning slits 151, may be formed to be relatively thick. This makes it easier to manufacture the organic layer deposition assembly 800.

Figure 11:
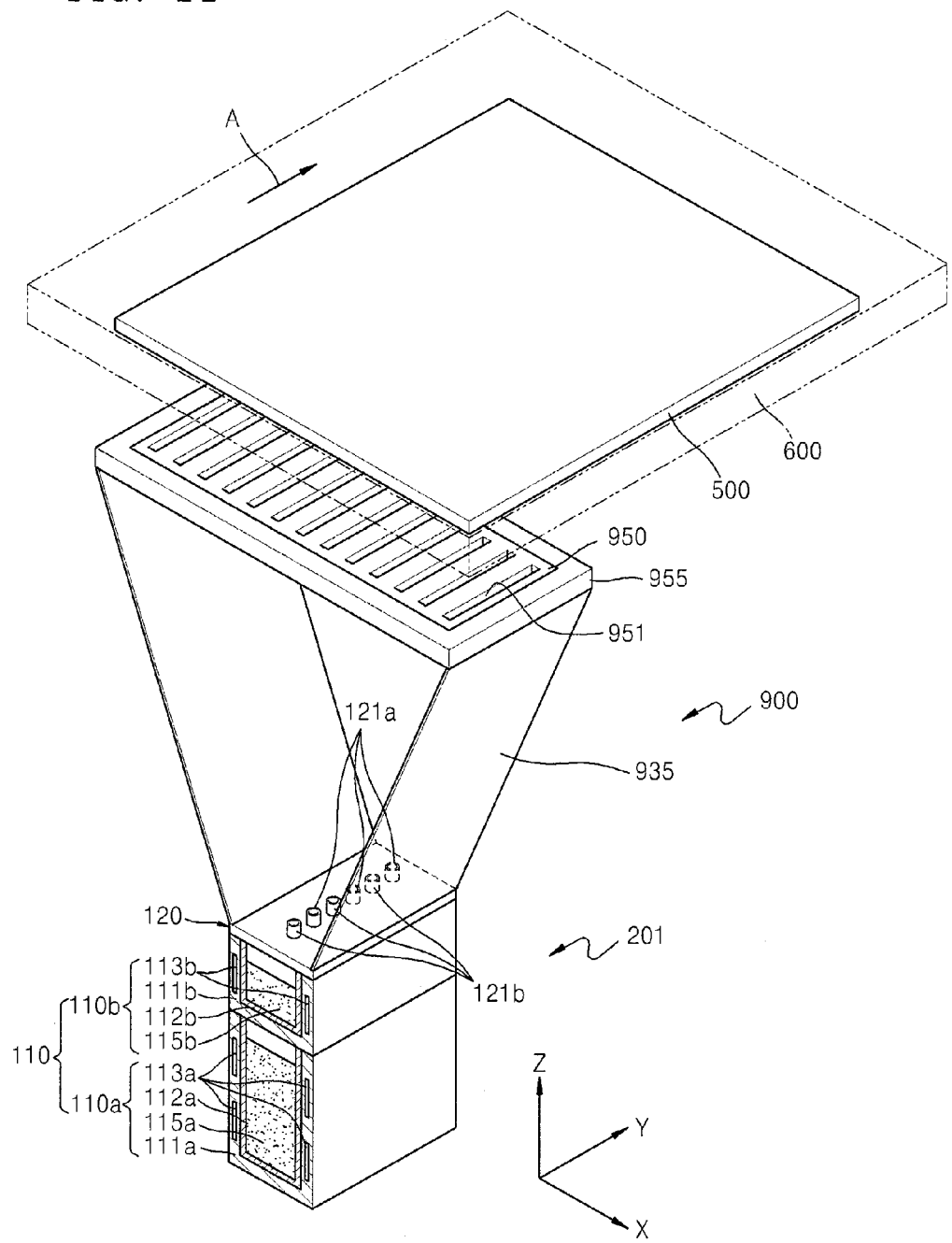
FIG. 11 is a schematic perspective cutaway view of an organic layer deposition assembly according to another embodiment of the present invention.

FIG. 11 is a schematic perspective cutaway view of an organic layer deposition assembly 900 according to another embodiment of the present invention. Referring to FIG. 11, the organic layer deposition assembly 900 includes a deposition source assembly 201 and a patterning slit sheet 950.

As described above, referring to FIG. 12, a deposition source 110 includes a first deposition source 110*a*, and a second deposition source 110*b* disposed on the first deposition source 110*a*. The first deposition source 110*a* includes a crucible 112*a* filled with a host material 115*a*, and a heater 113*a* that heats the crucible 112*a*. The second deposition source 110*b* includes a crucible 112*b* filled with a dopant material 115*b*, and a heater 113*b* that heats the crucible 112*b*. To smoothly discharge the host material 115*a* and the dopant material 115*b*, the temperature of the second deposition source 110*b* on the first deposition source 110*a* is maintained to be higher than that of the first deposition source 110*a*. Although each of the host material 115*a* and the dopant material 115*b* may be included in any of the first and second deposition sources 110*a* and 110*b*, the amount of the host material 115*a* should be greater than that of the dopant material 115*b*, and thus, the size of a deposition source containing the host material 115*a* should be greater than that of a deposition source containing the dopant material 115*b*.

As described above, a deposition source nozzle unit 120 is disposed at a side of the deposition source 110, and in particular, at a side of the second deposition source 110*b* facing the substrate 500. The deposition source nozzle unit 120 includes a plurality of first deposition source nozzles 121*a* and a plurality of second deposition sources 121*b* arranged in the X-axis direction. The deposition source nozzle unit 120 includes a first deposition source nozzle unit including the plurality of first deposition source nozzles 121*a*, and a second deposition source nozzle unit including the plurality of second deposition source nozzles 121*b*. The plurality of first deposition source nozzles 121*a* pass through the second deposition source 110*b* and are positioned at a side of the second deposition source 110*b*. The plurality of first deposition source nozzles 121*a* and the plurality of second deposition source nozzles 121*b* are alternately disposed. Thus, the host material 115*a* and the dopant material 115*b* may be evenly deposited on a set or predetermined discharge region.

The patterning slit sheet 950 and a frame 955 are further disposed between the deposition source 110 and the substrate 500. The patterning slit sheet 950 includes a plurality of patterning slits 951 arranged in the X-axis direction. The deposition source 110 and the deposition source nozzle unit 120 are combined with the patterning slit sheet 950 via connection members 935.

The current embodiment is different from the previous embodiments, in terms of the arrangement of the plurality of first deposition source nozzles 121*a* and the plurality of second deposition source nozzles 121*b* included in the deposition source nozzle unit 120. This is described in detail below.

The deposition source nozzle unit 120 is disposed at a side of the deposition source 110, and in particular, at the side of the deposition source 110 facing the substrate 500. The deposition source nozzle unit 120 includes a plurality of first deposition source nozzles 121*a* and a plurality of second deposition source nozzles 121*b* in the Y-axis direction, i.e., a scanning direction of the substrate 500.

As described above, when the plurality of first and second deposition source nozzles 121*a* and 121*b* are formed on the deposition source nozzle unit 120 in the Y-axis direction, that is, the scanning direction of the substrate 500, the size of a pattern formed of the host material 115*a* and the dopant material 115*b* discharged through each of the plurality of slits 950 of the patterning slit sheet 951 is affected by the size of one of the plurality of first and second deposition source nozzles 121*a* and 121*b* (since there is only one line of the plurality of first and second deposition source nozzles 121*a* and 121*b* in the X-axis direction). Thus, no shadow zone may be formed on the substrate 500. In addition, since the plurality of first and second deposition source nozzles 121*a* and 121*b* are arranged in the scanning direction of the substrate 500, even if there is a difference in flux between the plurality of first and second deposition source nozzles 121*a* and 121*b*, the difference may be compensated for and deposition uniformity may be maintained constant. Furthermore, the organic layer deposition assembly 900 does not include a barrier plate assembly, such as that shown in FIG. 7, the deposition material is not deposited on the barrier plate assembly, thereby improving utility efficiency of the host and dopant materials 115*a* and 115*b*.

Figure 12:
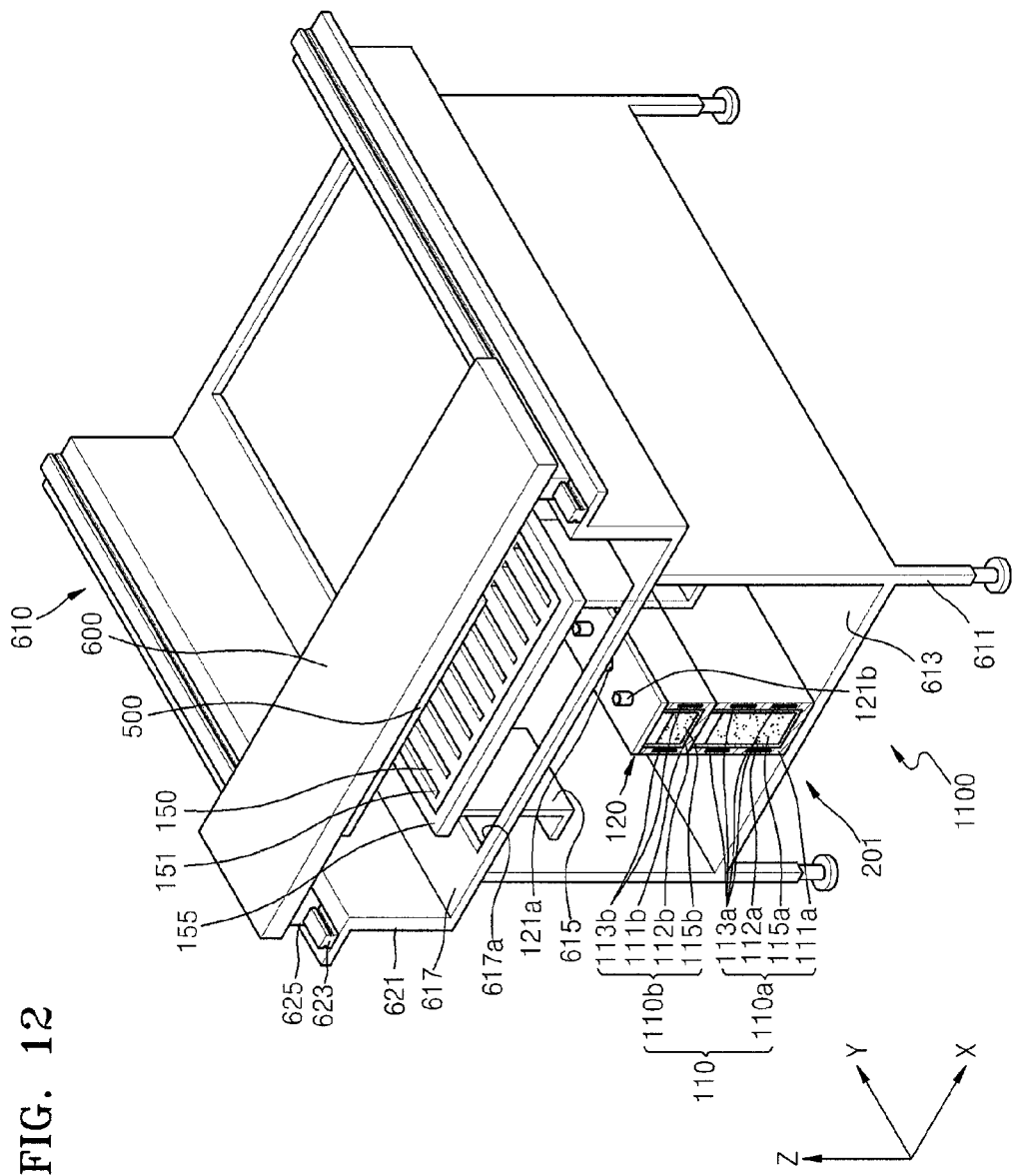
FIG. 12 is a schematic perspective cutaway view of an organic layer deposition assembly and a first conveyor unit included in an organic layer deposition apparatus, according to another embodiment of the present invention.
Figure 13:
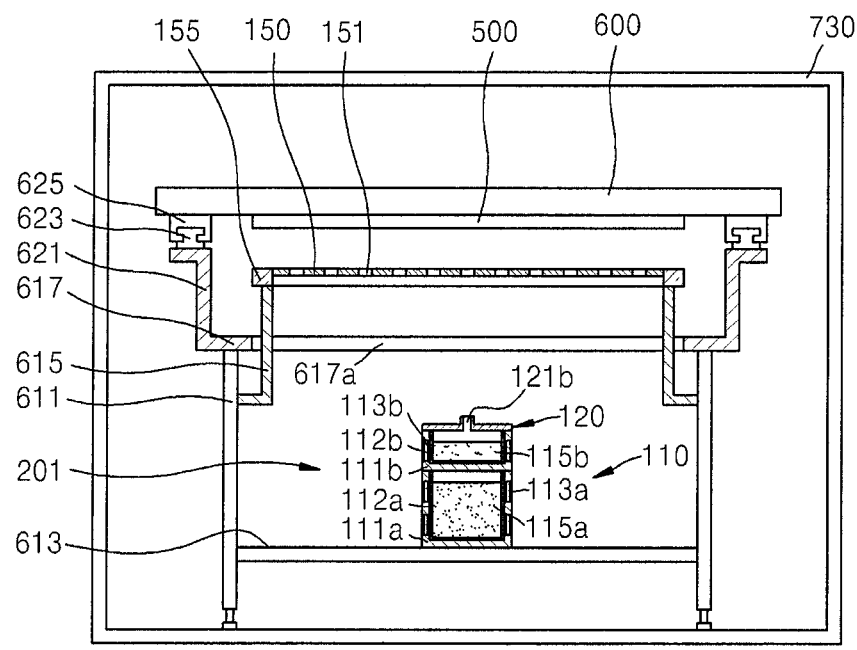
FIG. 13 is a schematic sectional plan view of the organic layer deposition assembly of FIG. 12.

FIG. 12 is a schematic perspective cutaway view of an organic layer deposition assembly 1100 and a first conveyor unit 610 included in an organic layer deposition apparatus, according to an embodiment of the present invention. FIG. 13 is a schematic plan cutaway view of the organic layer deposition apparatus of FIG. 12. In FIG. 13, a first chamber is not illustrated for convenience of explanation.

Referring to FIGS. 12 and 13, the organic layer deposition apparatus includes the first conveyor unit 610, and the organic layer deposition assembly 1100 of a deposition unit 730. The first conveyor unit 610 is constructed to move an electrostatic chuck 600 fixed with a substrate 500 to the deposition unit 730.

Specifically, the organic layer deposition assembly 1100 includes a deposition source assembly 201 and a patterning slit sheet 150.

As described above, referring to FIG. 12, a deposition source 110 includes a first deposition source 110a, and a second deposition source 110b disposed on the first deposition source 110a. The first deposition source 110a includes a crucible 112a filled with a host material 115a, and a heater 113a that heats the crucible 112a. The second deposition source 110b includes a crucible 112b filled with a dopant material 115b, and a heater 113b that heats the crucible 112b. To smoothly discharge the host material 115a and the dopant material 115b, the temperature of the second deposition source 110b on the first deposition source 110a is maintained to be higher than that of the first deposition source 110a. Although each of the host material 115a and the dopant material 115b may be included in any of the first and second deposition sources 110a and 110b, the amount of the host material 115a should be greater than that of the dopant material 115b, and thus, the size of a deposition source containing the host material 115a should be greater than that of a deposition source containing the dopant material 115b.

As described above, a deposition source nozzle unit 120 is disposed at a side of the deposition source 110, and in particular, at a side of the second deposition source 110b facing the substrate 500. The deposition source nozzle unit 120 includes a plurality of first deposition source nozzles 121a and a plurality of second deposition sources 121b arranged in the X-axis direction. The deposition source nozzle unit 120 includes a first deposition source nozzle unit including the plurality of first deposition source nozzles 121a, and a second deposition source nozzle unit including the plurality of second deposition source nozzles 121b. The plurality of first deposition source nozzles 121a pass through the second deposition source 110b and are positioned at a side of the second deposition source 110b. The plurality of first deposition source nozzles 121a and the plurality of second deposition source nozzles 121b are alternately disposed. Thus, the host material 115a and the dopant material 115b may be evenly deposited on a set or predetermined discharge region.

The patterning slit sheet 150 and a frame 155 are further disposed between the deposition source 110 and the substrate 500. The patterning slit sheet 150 includes a plurality of patterning slits 151 arranged in the X-axis direction. The current embodiment is different from the previous embodiments, in that the deposition source 110, the deposition source nozzle unit 120, and the patterning slit sheet 150 are not integrated in one unit, but are separately included in the deposition unit 730. This will be described later in detail.

The first conveyor unit 610 will now be described in detail. The first conveyor unit 610 allows the electrostatic chuck 600 fixed with the substrate 500 to move. The first conveyor unit 610 includes a frame 611 including a lower plate 613 and an upper plate 617, a sheet support unit 615 disposed in the frame 611, a guide support unit 621 disposed on the frame 611, a pair of guide rails 623 disposed on the guide support unit 621, and a plurality of guide blocks 625 disposed on the pair of guide rails 623.

Specifically, the frame 611 forms as a base of the first conveyor unit 610, and is formed in a hollow box shape. The lower plate 613 forms a lower surface of the frame 611, and the deposition source 110 may be disposed on the lower plate 613. The upper plate 617 forms an upper surface of the frame 611, and may have an aperture 617a so that the host material 115a and the dopant material 115b vaporized in the deposition source 110 may pass through the patterning slit sheet 150 and then be deposited on the substrate 500. The elements of the frame 611 may be individually manufactured and then be combined with one another, or may be manufactured to be integrated in one unit.

Although not shown, the lower plate 613 on which the deposition source 110 is disposed is formed in a cassette shape so that the lower plate 613 may be taken out of the frame 611. Thus, it is possible to easily exchange the deposition source 110 with another deposition source.

The sheet support unit 615 may protrude from an inner side surface of the frame 611, and may support the patterning slit sheet 150. The sheet support unit 615 may guide the host material 151a and the dopant material 115b, which are discharged through the plurality of first and second deposition source nozzles 121a and 121b, to move straight, and not to flow in the X-axis direction.

As described above, in the current embodiment, deposition is performed while the electrostatic chuck 600 (fixed with the substrate 500) makes a linear movement within the chamber. In one case, a roller or a conveyor that are generally used to transfer an object may be used. Otherwise, a linear motion (LM) system as illustrated in FIGS. 12 and 13, which includes guide rails and guide blocks, may be used to precisely transfer the substrate 500.

Specifically, the guide support unit 621 on the upper plate 617, and the pair of guide rails 623 on the guide support unit 621 are installed to pass through the first chamber of the deposition unit 730.

An upper portion of the guide support unit 621 has a substantial planar shape, and the pair of guide rails 623 are disposed on the guide support unit 621. The pair of guide blocks 625 are respectively joined with the pair of guide rails 623 so that the pair of guide blocks 625 may make a reciprocating movement along the pairs of guide rails 623.

Each of the pair of guide blocks 625 may include a driver (not shown). The driver moves the guide block 625 along the guide rail 623, and may generate and apply a driving force to the guide block 625 or may receive a driving force from a separate driving source and then apply the driving force to the guide block 625.

A pair of LM rails may be used as the pair of guide rails 623 and a pair of LM blocks may be used as the pair of guide blocks 625, thereby forming an LM system. The LM system is a transfer system that offers very high positioning accuracy since it has a low friction coefficient and hardly causes a positioning error to occur, compared to comparable sliding guide systems. In the present specification, a detailed description of the LM system is not provided.

As described above, according to an embodiment of the present invention, a mask is formed to be smaller than a substrate, and deposition is performed while the mask is moved relative to the substrate. Thus, the mask can be easily manufactured. In addition, defects caused due to the contact between a substrate and a mask, which occur in the comparable deposition method, may be reduced or prevented. Furthermore, since it is unnecessary to dispose the mask in close contact with the substrate during a deposition process, the manufacturing time may be reduced.

Also, the deposition source assembly 201 and the patterning slit sheet 150 that constitute the organic layer deposition assembly 1100 are not integrated in one unit, but are separately included in the deposition unit 730. Accordingly, the deposition source 110 may be easily attached to and detached from the organic layer deposition assembly 1100 so as to fill the deposition source 110 with the host material 115a and the dopant material 115*b*. Also, the patterning slit sheet 150 may be easily attached to and detached from the organic layer deposition assembly 1100 to either cleanse the patterning slit sheet 150 or exchange the patterning slit sheet 150 with another patterning slit sheet.

Figure 14:
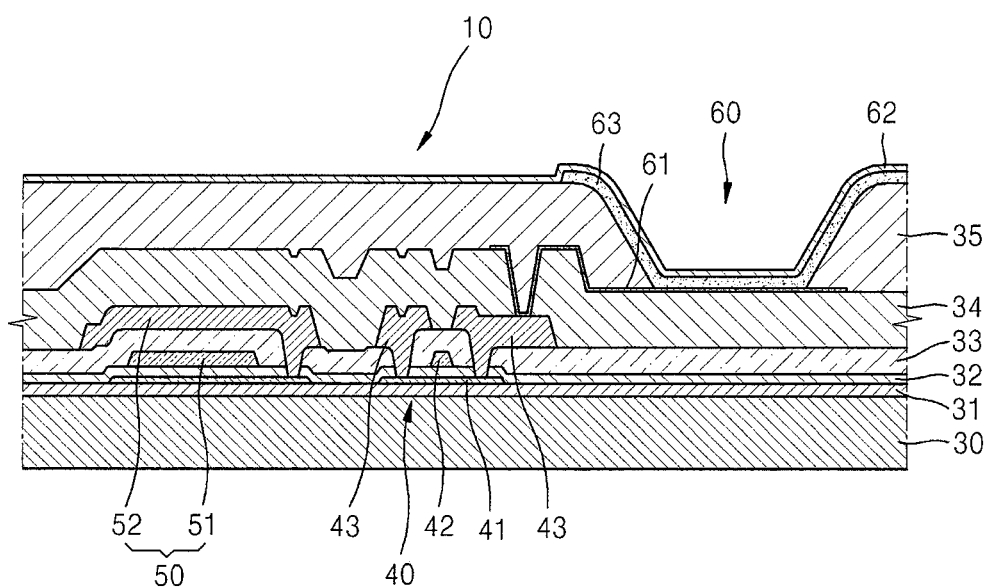
FIG. 14 is a cross-sectional view of an active matrix organic light-emitting display apparatus manufactured by using an organic layer deposition apparatus, according to an embodiment of the present invention.

FIG. 14 is a cross-sectional view of an active matrix organic light-emitting display apparatus 10 manufactured by using an organic layer deposition apparatus, according to an embodiment of the present invention. Referring to FIG. 14, the active matrix organic light-emitting display apparatus 10 is formed on the substrate 500 of FIG. 7, 10, 11, or 12. The substrate 500 may be formed of a transparent material, for example, glass, plastic, or metal. An insulating layer 31, such as a buffer layer, is formed on an entire surface of the substrate 500.

Referring to FIG. 14, a thin film transistor (TFT) 40, a capacitor 50, and an organic light-emitting diode (OLED) 60 are disposed on the insulating layer 31.

A semiconductor active layer 41 is formed in a predetermined pattern on the insulating layer 31. A gate insulating layer 32 is formed to cover the semiconductor active layer 41. The semiconductor active layer 41 may include a p-type or n-type semiconductor material.

A first capacitor electrode 51 of the capacitor 50 is formed on a region of the gate insulating layer 32, and a gate electrode 42 of the TFT 40 is formed on another region of the gate insulating layer 32 corresponding to the semiconductor active layer 41. An interlayer insulating layer 33 is formed to cover the first capacitor electrode 51 and the gate electrode 42. Then, the gate insulating layer 32 and the interlayer insulating layer 33 are etched by, for example, dry etching, to form a contact hole for exposing parts of the semiconductor active layer 41.

Then, a second capacitor electrode 52 of the capacitor 50 and a source/drain electrode 43 are formed on the interlayer insulating layer 33. The source/drain electrode 43 is formed on the interlayer insulating layer 33 to contact the semiconductor active layer 41 exposed through the contact hole. A passivation layer 34 is formed to cover the source/drain electrode 43, and is etched to expose a part of the drain electrode 43. An additional insulating layer (not shown) may be further formed on the passivation layer 34 so as to planarize the passivation layer 34.

The OLED 60 displays set or predetermined image information by emitting red, green, or blue light as current flows therethrough. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening is formed in the pixel defining layer 35, and then an organic layer 63 including an emission layer is formed in a region defined by the opening. A second electrode 62 is formed on the organic layer 63.

The pixel defining layer 35, which defines individual pixels, is formed of an organic material. The pixel defining layer 35 planarizes the surface of a region of the substrate 500 in which the first electrode 61 is formed, and in particular, the surface of the passivation layer 34.

The first electrode 61 and the second electrode 62 are insulated from each other, and respectively apply voltages of opposite polarities to the organic layer 63 to induce light emission.

The organic layer 63 may be formed of a low-molecular weight organic material or a high-molecular weight organic material. If the low-molecular weight organic material is used, then the organic layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), or the like.

After the organic layer 63 is formed, the second electrode 62 may be formed according to the same deposition method used to form the organic layer 63.

The first electrode 61 may function as an anode and the second electrode 62 may function as a cathode, or vice versa. The first electrode 61 may be patterned to correspond to individual pixel regions, and the second electrode 62 may be formed to cover all the pixels.

The first electrode 61 may be formed as a transparent electrode or a reflective electrode. The transparent electrode may be formed of an indium tin oxide (ITO), an indium zinc oxide (IZO), a zinc oxide (ZnO), and/or an indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and then forming a transparent electrode layer of an ITO, an IZO, a ZnO, and/or an $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. The transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63, and forming an auxiliary electrode layer or a bus electrode line thereon from ITO, IZO, ZnO, $In_2O_3$, or the like. When the second electrode 62 is formed as a reflective electrode, a reflective layer may be formed by depositing Li, Ca, LiF/Ca, LiF/Al, Al, Ag, Mg, or a compound thereof on the organic layer 63. The second electrode 62 may be formed according to the same deposition method used to form the organic layer 63.

The organic layer deposition apparatus according to the above embodiment of the present invention may be applied to form an organic or inorganic layer of an organic TFT, and to form layers from various materials.

In the embodiments of FIGS. 7 to 13, the deposition source assembly 201 of FIG. 1 is employed, but the deposition source assembly 202 of FIG. 4 may be used instead of the deposition source assembly 201. In this case, in each of the organic layer deposition assemblies 100 and 800 of FIGS. 7 to 10, each of the barrier plates 131 (or 831) may be disposed between two adjacent deposition source nozzle units, each comprising of one of the plurality of first deposition source nozzles 121*a*' and one of the plurality of second deposition source nozzles 121*b*'. In other words, each of the plurality of first deposition source nozzles 121*a*' concentrically included in the respective second deposition source nozzles 121*b*' may be disposed between two adjacent barrier plates 131.

As described above, according to an embodiment of the present invention, an organic layer deposition apparatus may be easily manufactured and may be simply applied to the manufacture of large-sized display devices on a mass scale, and an organic light-emitting display apparatus may be manufactured by using the organic layer deposition apparatus. The organic layer deposition apparatus may improve manufacturing yield and deposition efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light-emitting display apparatus, the method comprising:
    disposing an organic layer deposition apparatus to be apart from a substrate, which is a deposition target, by a set distance,
    wherein the organic light-emitting display apparatus comprises:
        a deposition source for discharging a deposition material;
        a deposition source nozzle unit disposed at a side of the deposition source; and
        a patterning slit sheet disposed facing the deposition source nozzle unit, being smaller than the substrate, and comprising a plurality of patterning slits,
    wherein the deposition source comprises:
        a first deposition source; and
        a second deposition source stacked on the first deposition source,
    wherein the deposition source nozzle unit comprises:
        a second deposition source nozzle unit disposed at a side of the second deposition source to face the substrate and comprising a plurality of second deposition source nozzles; and
        a first deposition source nozzle unit disposed at the side of the second deposition source to face the substrate and comprising a plurality of first deposition source nozzles formed to pass through the second deposition source; and
    depositing the deposition material on the substrate while the organic layer deposition apparatus or the substrate is moved relative to the other.

2. The method of claim 1, wherein a host material is discharged from the first deposition source, and a dopant material is discharged from the second deposition source.

3. The method of claim 2, wherein the host material contained in the first deposition source is greater in amount than that of the dopant material contained in the second deposition source.

4. The method of claim 1, wherein, a dopant material is discharged from the first deposition source, and a host material is discharged from the second deposition source.

5. The method of claim 4, wherein the host material contained in the second deposition source is greater in amount than that of the dopant material contained in the first deposition source.

6. The method of claim 1, wherein temperature of the second deposition source is maintained to be higher than temperature of the first deposition source.

7. The method of claim 1, wherein the plurality of first deposition source nozzles and the plurality of second deposition source nozzles are arranged in a line at the side of the second deposition source to face the substrate, and are alternately arranged.

8. The method of claim 1, wherein the plurality of first deposition source nozzles and the plurality of second deposition source nozzles are arranged in a line at the side of the second deposition source to face the substrate, and each of the plurality of first deposition source nozzles is concentrically included in a corresponding one of the plurality of second deposition source nozzles.

9. The method of claim 1, wherein the plurality of first and second deposition source nozzles are arranged in a first direction, and
    the plurality of patterning slits are arranged in a second direction perpendicular to the first direction.

10. The method of claim 1, wherein the plurality of first and second deposition source nozzles are arranged in a first direction,
    the plurality of patterning slits are arranged in the first direction, and
    the apparatus further comprises a barrier plate assembly comprising a plurality of barrier plates disposed between the deposition source nozzle unit and the patterning slit sheet in the first direction, the plurality of barrier plates are for partitioning a deposition space between the deposition source nozzle unit and the patterning slit sheet, into a plurality of sub-deposition spaces.

11. The method of claim 1, wherein the organic layer deposition apparatus further comprises a chamber,
    the plurality of deposition source nozzles are arranged in a first direction,
    the patterning slit sheet is fixedly combined with an inner side of the chamber, and
    the plurality of patterning slits are arranged in a second direction perpendicular to the first direction.

* * * * *